(12) United States Patent
Yang et al.

(10) Patent No.: US 8,956,739 B2
(45) Date of Patent: Feb. 17, 2015

(54) POLYMER AND ORGANIC LIGHT-EMITTING DEVICE COMPRISING THE SAME

(75) Inventors: Hye-yeon Yang, Seoul (KR); Ho-suk Kang, Seoul (KR); Jhun-mo Son, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 378 days.

(21) Appl. No.: 13/197,562

(22) Filed: Aug. 3, 2011

(65) Prior Publication Data

US 2012/0181513 A1    Jul. 19, 2012

(30) Foreign Application Priority Data

Jan. 17, 2011   (KR) .................. 10-2011-0004532

(51) Int. Cl.
| | | |
|---|---|---|
| *H01L 51/54* | (2006.01) | |
| *C08F 126/06* | (2006.01) | |
| *C08G 61/12* | (2006.01) | |
| *H01L 51/00* | (2006.01) | |
| *H01L 51/50* | (2006.01) | |

(52) U.S. Cl.
CPC .......... *C08G 61/122* (2013.01); *H01L 51/0043* (2013.01); *C08G 2261/3221* (2013.01); *C08G 2261/95* (2013.01); *H01L 51/5016* (2013.01); *Y10S 428/917* (2013.01)
USPC ........ 428/690; 428/917; 428/411.1; 526/261; 526/259

(58) Field of Classification Search
None
See application file for complete search history.

(56) References Cited

U.S. PATENT DOCUMENTS

| | | | |
|---|---|---|---|
| 3,814,719 A | 6/1974 | Seltzer et al. | |
| 2006/0246315 A1 | 11/2006 | Begley et al. | |
| 2010/0184942 A1 | 7/2010 | Chen et al. | |
| 2010/0327738 A1* | 12/2010 | Toba et al. | 313/504 |

FOREIGN PATENT DOCUMENTS

| | | |
|---|---|---|
| JP | 2006-156445 A | 6/2006 |
| JP | 2010-013421 A | 1/2010 |
| WO | 2005/053055 A1 | 6/2005 |
| WO | 2008025997 A1 | 3/2008 |
| WO | 2008/056746 A1 | 5/2008 |
| WO | 2009/104708 A1 | 8/2009 |

OTHER PUBLICATIONS

European Extended Search Report dated May 7, 2012 for Application No. 12151327.9-2102.

Omer, K.M. et al., Electrochemical Behavior and Electrogenerated Chemiluminescence of Star-shaped D-A Compounds with a 1,3,5-Triazine Core and Substituted Fluorene Arms, J. Am Chem Soc., 2010; 132 (31):10944-10952.

H. Inomata et al., High-Efficiency Organic Electrophosphorescent Diodes Using 1,3,5-Triazine Electron Transport Materials, Chem. Mater. 2004, 16, pp. 1285-1291.

P. Marsal et al., Molecular hosts for triplet emission in light emitting diodes: A quantum-chemical study, Chemical Physics Letters 392 (2004), pp. 521-528.

* cited by examiner

*Primary Examiner* — J. L. Yang
(74) *Attorney, Agent, or Firm* — Cantor Colburn LLP

(57) ABSTRACT

A polymer and an organic light-emitting device including the polymer.

20 Claims, 6 Drawing Sheets

POLYMER AND ORGANIC LIGHT-EMITTING DEVICE COMPRISING THE SAME

CROSS-REFERENCE TO RELATED APPLICATIONS

This application claims priority to Korean Patent Application No. 10-2011-0004532, filed on Jan. 17, 2011, and all the benefits accruing therefrom under 35 U.S.C. §119, the content of which in its entirety is herein incorporated by reference.

BACKGROUND

1. Field

This disclosure relates to polymers and organic light-emitting devices including the polymers.

2. Description of the Related Art

Organic light-emitting devices are active emission-type devices, and are lightweight, require a small number of components, have a simple manufacturing process, a high image quality, and a wide viewing angle, perfectly embody high color purity and moving pictures, and operate with low power consumption at low voltage. Due to such characteristics, they have electric characteristics suitable for various electronic applications For example, the organic light-emitting device includes an anode disposed on a substrate, an organic layer including a hole transport layer, an emitting layer, an electron transport layer, and additional optional layers disposed on the anode, and a cathode disposed on the organic layer.

If a current is applied to the anode and the cathode, holes injected from the anode move to the emitting layer through the hole transport layer and electrons injected from the cathode move to the emitting layer through the electron transport layer. The holes and electrons are recombined with each other in the emitting layer to generate excitons. Then, the excitons decay radiatively, thereby emitting light having a wavelength corresponding to a band gap of a corresponding material.

Materials for use in the organic layer may be classified as suitable for vacuum deposition or suitable for solution coating, according to a method of forming the organic layer. The material suitable for solution coating may be mixed with a solvent to provide a composition suitable for coating on a substrate, and the composition may be disposed onto a substrate using a known solution-coating method, such as inkjet printing, screen printing, or spin coating.

SUMMARY

Provided are polymers having a novel structure.

Also provided are organic light-emitting devices including the polymers.

Additional aspects will be set forth in part in the description which follows and, in part, will be apparent from the description, or may be learned by practice of the presented embodiments.

According to an embodiment, a polymer has a repeating unit represented by Formula 1 below:

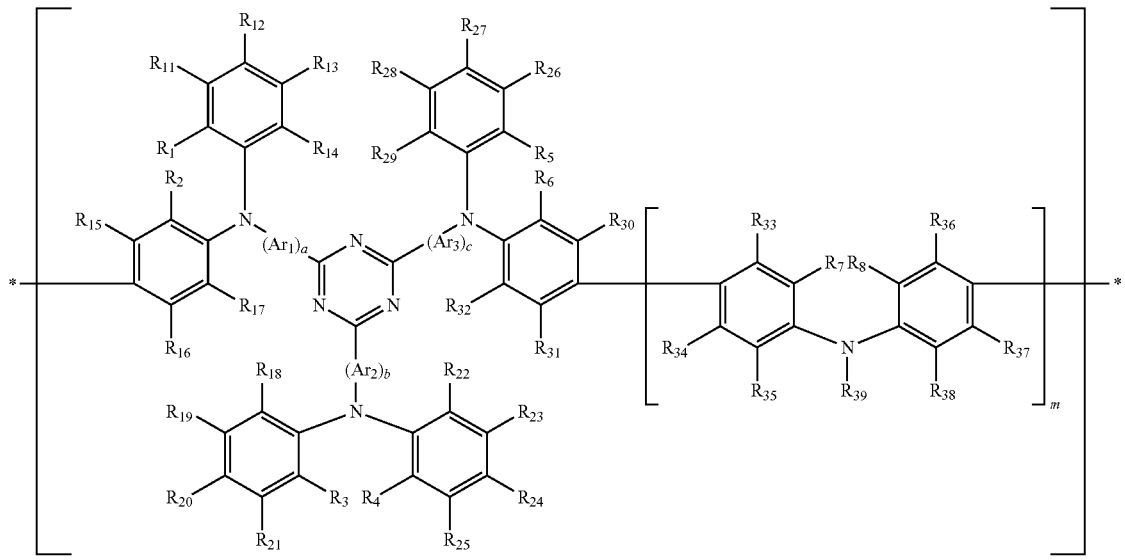

Formula 1 wherein, in Formula 1, in at least one pair of two R groups selected from a pair $R_1$ and $R_2$, a pair $R_3$ and $R_4$, a pair $R_5$ and $R_6$, and a pair $R_7$ and $R_8$, an atom in each R group thereof is connected to each other to form a single bond or connected to each other via a linking group represented by $-[C(Q_6)(Q_7)]_p-$, or $R_1$ to $R_8$ are each independently hydrogen, deuterium, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, $-N(Q_1)(Q_2)$ or $-Si(Q_3)(Q_4)(Q_5)$;

p is an integer of 1 or 2;

Ar$_1$ to Ar$_3$ are each independently a substituted or unsubstituted C$_6$-C$_{30}$ arylene group, or a substituted or unsubstituted C$_1$-C$_{30}$ heteroarylene group;

a, b, and c are each independently an integer of 1 to 10;

R$_{11}$ to R$_{39}$ are each independently hydrogen, deuterium, a halogen atom, a hydroxyl group, a cyano group, a nitro group, a carboxyl group, a substituted or unsubstituted C$_1$-C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{60}$ cycloalkyl group, a substituted or unsubstituted C$_3$-C$_{60}$ cycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, a substituted or unsubstituted C$_1$-C$_{60}$ heteroaryl group, —N(Q$_8$)(Q$_9$), or —Si(Q$_{10}$)(Q$_{11}$)(Q$_{12}$);

Q$_1$ to Q$_{12}$ are each independently hydrogen, deuterium, a halogen, a hydroxyl group, a cyano group, a nitro group, a carboxyl group, a substituted or unsubstituted C$_r$ C$_{60}$ alkyl group, a substituted or unsubstituted C$_2$-C$_{60}$ alkenyl group, a substituted or unsubstituted C$_2$-C$_{60}$ alkynyl group, a substituted or unsubstituted C$_1$-C$_{60}$ alkoxy group, a substituted or unsubstituted C$_3$-C$_{60}$ cycloalkyl group, a substituted or unsubstituted C$_3$-C$_{60}$ cycloalkenyl group, a substituted or unsubstituted C$_6$-C$_{60}$ aryl group, a substituted or unsubstituted C$_6$-C$_{60}$ aryloxy group, a substituted or unsubstituted C$_6$-C$_{60}$ arylthio group, or a substituted or unsubstituted C$_1$-C$_{60}$ heteroaryl group; and m is an integer of 0 to 5.

The polymer may be used as a phosphorescent host in an emitting layer of an organic light-emitting device.

According to another embodiment, an organic light-emitting device may include a substrate; a first electrode; a second electrode; and a first layer that is disposed between the first electrode and the second electrode and includes the polymer as described above.

BRIEF DESCRIPTION OF THE DRAWINGS

The above and other aspects, advantages and features of this disclosure will become more apparent by describing in further detail embodiments thereof with reference to the accompanying drawings, in which.

DETAILED DESCRIPTION

Figure 1:
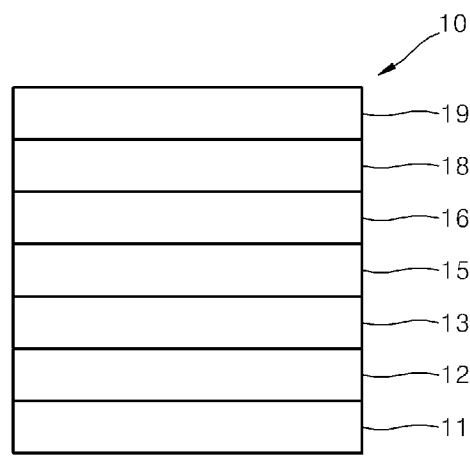
FIG. 1 is a schematic sectional view of an organic light-emitting device according to an embodiment.

The invention now will be described more fully hereinafter with reference to the accompanying drawings, in which various embodiments are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

The terminology used herein is for the purpose of describing particular embodiments only and is not intended to be limiting. As used herein, the singular forms "a," "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. It will be further understood that the terms "first" and "second" are used to differentiate one element from another element; they are not intended to specify any numerical order.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

According to an embodiment, provided is a polymer having a repeating unit represented by Formula 1 below:

Formula 1

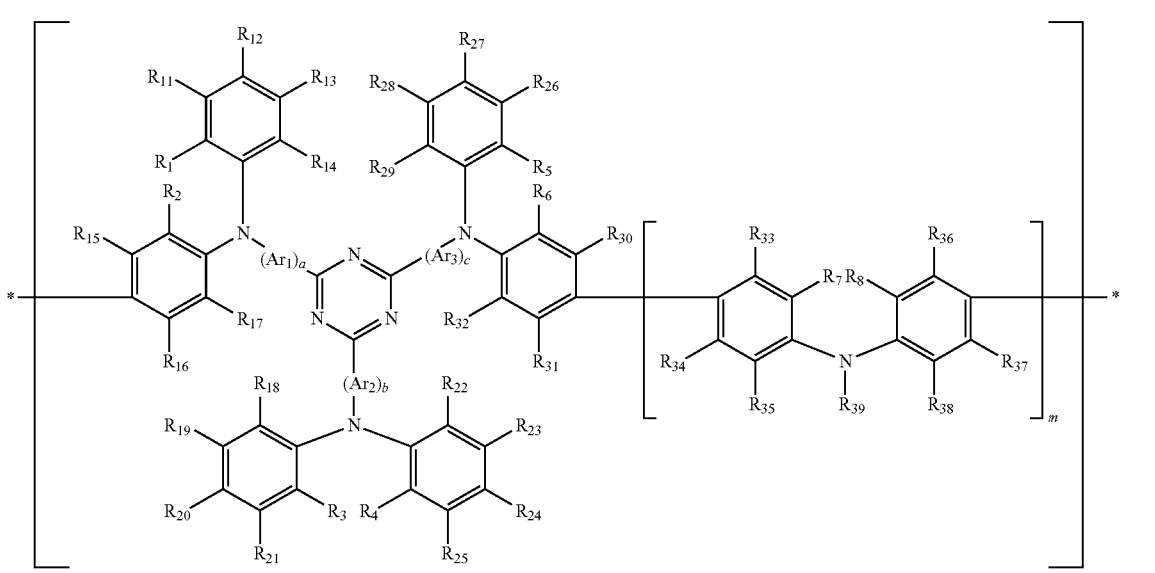

wherein, in Formula 1, in at least one pair of two R groups selected from a pair $R_1$ and $R_2$, a pair $R_3$ and $R_4$, a pair $R_5$ and $R_6$, and a pair $R_7$ and $R_8$, an atom in each R group thereof may be connected to each other to form a single bond or connected to each other via a linking group represented by —[C(Q$_6$)(Q$_7$)]$_p$—. In Formula 1, p may be 1 or 2.

In an embodiment, in at least one pair selected from a pair $R_1$ and $R_2$, a pair $R_3$ and $R_4$, a pair $R_5$ and $R_6$, and a pair $R_7$ and $R_8$, an atom of each R group thereof is connected to each other. Alternatively, each pair selected from a pair $R_1$ and $R_2$, a pair $R_3$ and $R_4$, a pair $R_5$ and $R_6$, and a pair $R_7$ and $R_8$, an atom of each R group thereof is connected to each other. For example, n an embodiment, $R_1$ and $R_2$ are connected to each other to form a single bond, (forming, a carbazole ring for example), a double bond, or a triple bond, $R_3$ and $R_4$ are connected to each other to form a single bond (forming a carbazole ring for example), a double bond, or a triple bond, $R_5$ and $R_6$ are connected to each other to form a single bond (forming a carbazole ring for example), a double bond, or a triple bond, and $R_7$ and $R_8$ are not connected to each other. In another embodiment, in each of the pairs $R_1$ and $R_2$, $R_3$ and $R_4$, $R_5$ and $R_6$, and $R_7$ and $R_8$, an atom of each R group thereof are connected to each other.

In addition, in at least one pair selected from a pair $R_1$ and $R_2$, a pair $R_3$ and $R_4$, a pair $R_5$ and $R_6$, and a pair $R_7$ and $R_8$, an atom of each R group thereof is connected to each other, and the resultant structures may be the same or different from each other. For example, in each of a pair $R_1$ and $R_2$, a pair $R_3$ and $R_4$, and a pair $R_5$ and $R_6$, an atom of each R group thereof is are connected to each other to form a single bond (forming a carbazole ring for example), and the R groups of a pair $R_7$ and $R_8$ are connected to each other to form a —CH$_2$- linking group (forming an acridine ring, for example).

$Q_6$ and $Q_7$ in Formula 1 may each be independently hydrogen, deuterium, a halogen atom, a hydroxyl group, a cyano group, a nitro group, a carboxyl group, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_6$-$C_{14}$ aryl group, or a substituted or unsubstituted $C_1$-$C_{14}$ heteroaryl group.

For example, $Q_6$ and $Q_7$ may each be independently hydrogen, deuterium, a halogen atom, a hydroxyl group, a cyano group, a nitro group, a carboxyl group, a $C_1$-$C_{10}$ alkyl group, or a $C_1$-$C_{10}$ alkoxy group, but are not limited thereto.

Alternatively, in Formula 1, $R_1$ to $R_8$ may each be independently hydrogen, deuterium, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, —N(Q$_1$)(Q$_2$), or —Si(Q$_3$)(Q$_4$)(Q$_5$). That is, in this embodiment, none of a pair $R_1$ and $R_2$, a pair $R_3$ and $R_4$, a pair $R_5$ and $R_6$, and a pair $R_7$ and $R_8$ are connected to each other.

In a specific embodiment, $R_1$ to $R_8$ may each be independently hydrogen, deuterium, a halogen atom, a hydroxyl group, a cyano group, a nitro group, a carboxyl group, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_6$-$C_{14}$ aryl group, or a substituted or unsubstituted $C_1$-$C_{14}$ heteroaryl group.

For example, $R_1$ to $R_8$ may each be independently hydrogen, deuterium, a halogen atom, a hydroxyl group, a cyano group, a nitro group, a carboxyl group, a $C_1$-$C_{10}$ alkyl group, or a $C_1$-$C_{10}$ alkoxy group, but are not limited thereto.

In Formula 1, Ar$_1$ to Ar$_3$ may each be independently a substituted or unsubstituted $C_6$-$C_{30}$ arylene group, a substituted or unsubstituted $C_1$-$C_{30}$ heteroarylene group, a substituted or unsubstituted ($C_1$-$C_{10}$ alkyl)$C_6$-$C_{30}$ arylene group, a substituted or unsubstituted di($C_1$-$C_{10}$ alkyl)$C_6$-$C_{30}$ arylene group, a substituted or unsubstituted ($C_6$-$C_{14}$ aryl)$C_6$-$C_{30}$ arylene group, a substituted or unsubstituted di($C_6$-$C_{14}$ aryl)$C_6$-$C_{30}$ arylene group, a substituted or unsubstituted ($C_1$-$C_{10}$ alkyl)$C_1$-$C_{30}$ heteroarylene group, a substituted or unsubstituted di($C_1$-$C_{10}$ alkyl)$C_1$-$C_{30}$ heteroarylene group, a substituted or unsubstituted ($C_6$-$C_{14}$ aryl)$C_1$-$C_{30}$ heteroarylene group, or a substituted or unsubstituted di($C_6$-$C_{14}$ aryl)$C_1$-$C_{30}$ heteroarylene group.

For example, $Ar_1$ to $Ar_3$ may each be independently a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenanthrylene group, a substituted or unsubstituted anthrylene group, a substituted or unsubstituted fluoranthenylene group, a substituted or unsubstituted triphenylenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, or a substituted or unsubstituted isoxazolylene group.

For example, $Ar_1$ to $Ar_3$ may each be independently a phenylene group, a ($C_1$-$C_{10}$ alkyl)phenylene group, a di($C_1$-$C_{10}$ alkyl)phenylene group, a ($C_6$-$C_{14}$ aryl)phenylene group, a di($C_6$-$C_{14}$ aryl)phenylene group, a fluorenylene group, a ($C_1$-$C_{10}$ alkyl)fluorenylene group, a di($C_1$-$C_{10}$ alkyl)fluorenylene group, a ($C_6$-$C_{14}$ aryl)fluorenylene group, a di($C_6$-$C_{14}$ aryl)fluorenylene group, a phenanthrylene group, a ($C_1$-$C_{10}$ alkyl)phenanthrylene group, a di($C_1$-$C_{10}$ alkyl)phenanthrylene group, a ($C_6$-$C_{14}$ aryl)phenanthrylene group, a di($C_6$-$C_{14}$ aryl)phenanthrylene group, a pyridinylene group, a ($C_1$-$C_{10}$ alkyl)pyridinylene group, a di($C_1$-$C_{10}$ alkyl)pyridinylene group, a ($C_6$-$C_{14}$ arylene)pyridinylene group, or a di($C_6$-$C_{14}$ aryl)pyridinylene group, but are not limited thereto. Nonlimiting examples of the $C_6$-$C_{14}$ aryl include phenyl, naphthyl, anthryl, and the like.

According to an embodiment, in Formula 1, $Ar_1$ to $Ar_3$ may each be independently a substituted or unsubstituted phenylene group, a substituted or unsubstituted fluorenylene group, a substituted or unsubstituted phenanthrylene group, a substituted or unsubstituted pyridinylene group, or a substituted or unsubstituted phenylpyridinylene group, but are not limited thereto.

For example, $Ar_1$ to $Ar_3$ may all be the same.

In Formula 1, a, b, and c may each be independently an integer of 1 to 10. If a is 2 or more, two or more $Ar_1$ may be identical to or different from each other, if b is 2 or more, two or more $Ar_2$ may be identical to or different from each other, and if c is 2 or more, two or more $Ar_3$ may be identical to or different from each other.

For example, a, b, and c may each be independently 1, 2, 3, or 4, but are not limited thereto.

In Formula 1, —$(Ar_1)_a$—, —$(Ar_2)_b$—, and —$(Ar_3)_c$— may be identical to each other. For example, in Formula 1, —$(Ar_1)_a$—, —$(Ar_2)_b$—, and —$(Ar_3)_b$— may all be a phenylene group ($Ar_1$=$Ar_2$=$Ar_3$=phenylene group, a=b=c=1), a biphenylene group ($Ar_1$=$Ar_2$=$Ar_3$=phenylene group, a=b=c=2), a triphenylene group ($Ar_1$=$Ar_2$=$Ar_3$=phenylene group, a=b=c=3), a tetraphenylene group ($Ar_1$=$Ar_2$=$Ar_3$=phenylene group, a=b=c=4), a fluorenylene group ($Ar_1$=$Ar_2$=$Ar_3$=fluorenylene group, a=b=c=1), a phenanthrylene group ($Ar_1$=$Ar_2$=$Ar_3$=phenanthrylene group, a=b=c=1), a pyridinylene group ($Ar_1$=$Ar_2$=$Ar_3$=pyridinylene group, a=b=c=1), or a phenylpyridinylene group ($Ar_1$=$Ar_2$=$Ar_3$=phenylpyridinylene group, a=b=c=1), but are not limited thereto.

In Formula 1, $R_{11}$ to $R_{39}$ may each be independently hydrogen, deuterium, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, —N($Q_8$)($Q_9$), or —Si($Q_{10}$)($Q_{11}$)($Q_{12}$).

For example, $R_{11}$ to $R_{39}$ may each be independently hydrogen, deuterium, a halogen atom, a hydroxyl group, a cyano group, a nitro group, a carboxyl group, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_6$-$C_{14}$ aryl group, or a substituted or unsubstituted $C_1$-$C_{14}$ heteroaryl group.

According to an embodiment, in Formula 1, $R_{11}$ to $R_{39}$ may each be independently hydrogen, deuterium, a halogen atom, a hydroxyl group, a cyano group, a nitro group, a carboxyl group, a $C_1$-$C_{10}$ alkyl group, or a $C_1$-$C_{10}$ alkoxy group, but are not limited thereto.

In Formula 1, $R_{11}$ to $R_{19}$, $R_{21}$ to $R_{23}$ and $R_{25}$ to $R_{38}$ may all be hydrogen, and $R_{20}$, $R_{24}$ and $R_{39}$ may each be independently hydrogen, deuterium, a halogen, a hydroxyl group, a cyano group, a nitro group, a carboxyl group, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_6$-$C_{14}$ aryl group, or a substituted or unsubstituted $C_1$-$C_{14}$ heteroaryl group. For example, $R_{20}$, $R_{24}$, and $R_{39}$ may each be independently hydrogen, deuterium, a halogen atom, a hydroxyl group, a cyano group, a nitro group, a carboxyl group, a $C_1$-$C_{10}$ alkyl group, or a $C_1$-$C_{10}$ alkoxy group, but are not limited thereto.

In Formula 1, m may be an integer of 0 to 5. For example, m may be 0, 1, or 2, but is not limited thereto.

In Formula 1 (see Formula 1-1 below), moiety A, moiety C, and moiety D may be identical to each other. For example, in Formula 1, moieties A to D, as shown in Formula 1-1 below may all be identical to each other. By being so, hole mobility in a hole transporting part of the polymer including the repeating unit represented by Formula 1 may be improved (the hole transporting part of the polymer will be described in detail later where Formula 1-2 is described).

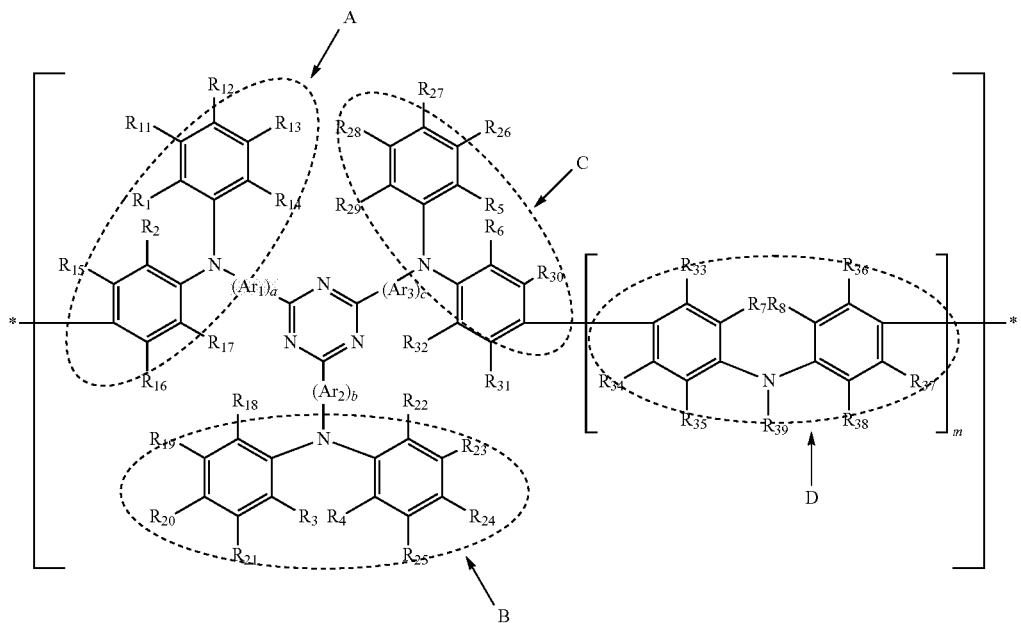

Formula 1-1

In an embodiment, the polymer repeating unit represented by Formula 1, may be, for example, represented by Formula 1A below, wherein, in Formula 1, the pair $R_1$ and $R_2$ are connected to each other to form a single bond, the pair $R_3$ and $R_4$ are connected to each other to form a single bond, the pair $R_5$ and $R_6$ are connected to each other to form a single bond, and the pair $R_7$ and $R_8$ are connected to each other to form a single bond. In an alternative embodiment, the polymer repeat unit represented by Formula 1 may be represented by Formula 1B below, wherein, in Formula 1, the pair $R_1$ and $R_2$ are connected to each other to form a —[$C(Q_6)(Q_7)$]- linking group, the pair $R_3$ and $R_4$ are connected to each other to form a —[$C(Q_6)(Q_7)$]- linking group, the pair $R_5$ and $R_6$ are connected to each other to form a —[$C(Q_6)(Q_7)$]- linking group, and the pair $R_7$ and $R_8$ are connected to each other to form a —[$C(Q_6)(Q_7)$]- linking group. In yet another embodiment, the polymer repeat unit represented by Formula 1, may be represented by Formula 10 below, wherein, in Formula 1, the pair $R_1$ and $R_2$ are connected to each other to form a —[$C(Q_6)(Q_7)$]$_2$- linking group, the pair $R_3$ and $R_4$ are connected to each other to form a —[$C(Q_6)(Q_7)$]$_2$- linking group, the pair $R_5$ and $R_6$ are connected to each other to form a —[$C(Q_6)(Q_7)$]$_2$- linking group, and the pair $R_7$ and $R_8$ are connected to each other to form a —[$C(Q_6)(Q_7)$]$_2$- linking group.

Formula 1A
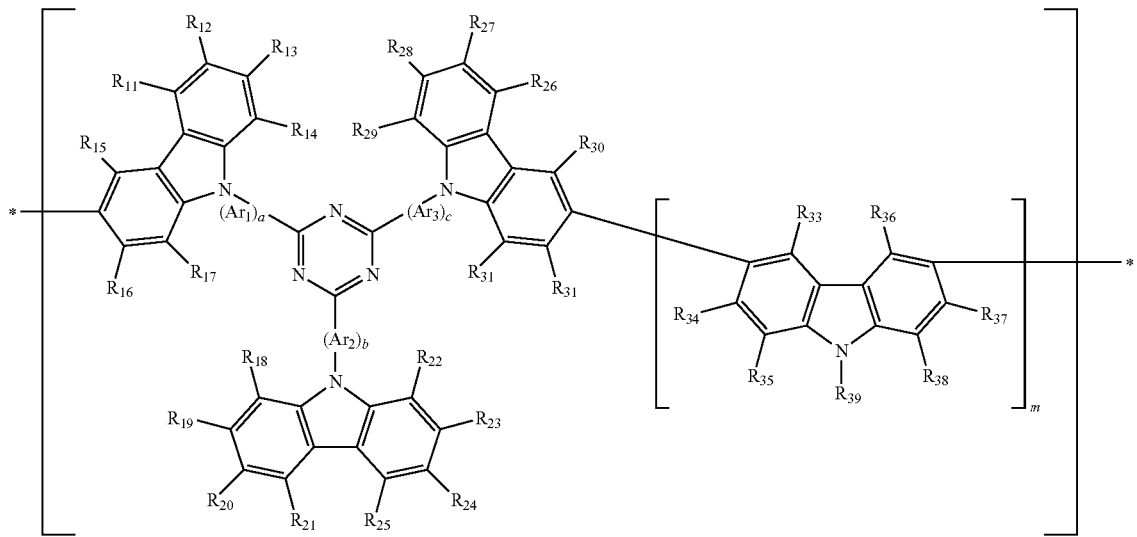
Formula 1B
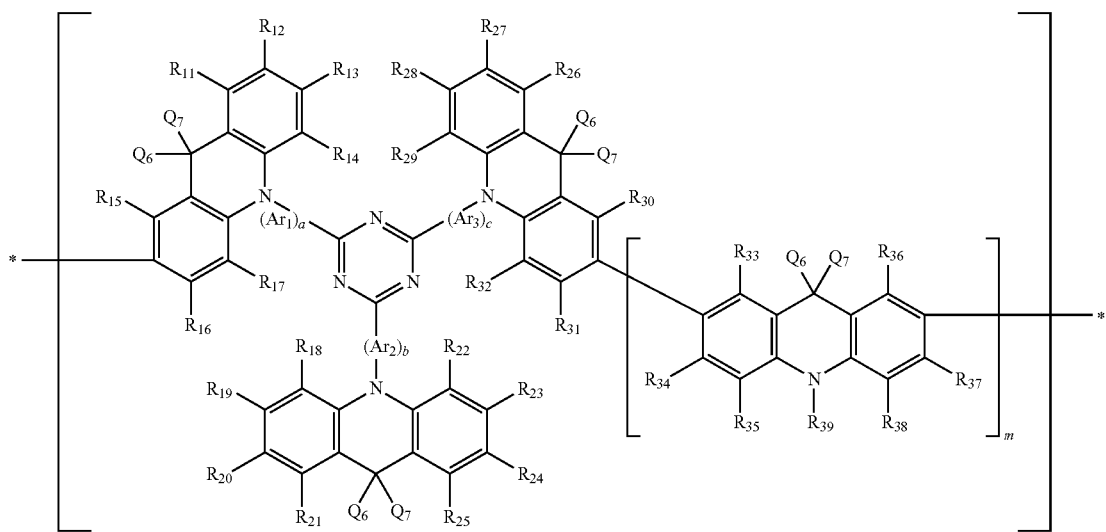

-continued

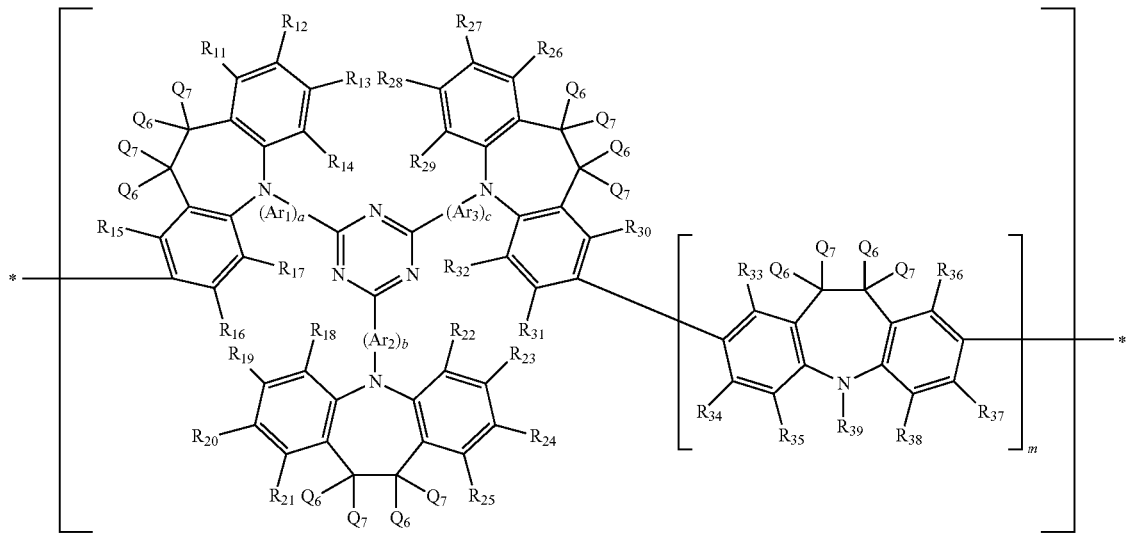

Formula 1C

In Formulae 1A, 1B, and 1C, $R_{11}$ to $R_{39}$, $Q_6$, $Q_7$, $Ar_1$ to $Ar_3$, a, b, c, and m are the same as described above with reference to Formula 1.

In an embodiment, in Formulae 1A, 1B, and 1C, $R_{11}$ to $R_{39}$ and $Q_6$ and $Q_7$ may each be independently hydrogen, deuterium, a halogen atom, a hydroxyl group, a cyano group, a nitro group, a carboxyl group, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_6$-$C_{14}$ aryl group, or a substituted or unsubstituted $C_1$-$C_{14}$ heteroaryl group; $Ar_1$ to $Ar_3$ may each be independently a substituted or unsubstituted phenylene group, a substituted or unsubstituted fluorenylene group, a substituted or unsubstituted phenanthrylene group, a substituted or unsubstituted pyridinylene group, or a substituted or unsubstituted phenylpyridinylene group; a, b, and c may each be independently an integer of 1 to 10; and m may be 0, 1, or 2.

In another embodiment, in Formulae 1A, 1B, and 1C, $R_{11}$ to $R_{19}$, $R_{21}$ to $R_{23}$, and $R_{25}$ to $R_{38}$ are all hydrogen, and $R_{20}$, $R_{24}$ and $R_{39}$ are each independently hydrogen, deuterium, a halogen atom, a hydroxyl group, a cyano group, a nitro group, a carboxyl group, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_6$-$C_{14}$ aryl group, or a substituted or unsubstituted $C_1$-$C_{14}$ hetero aryl group.

In still another embodiment, in Formulae 1A, 1B and 10, $Ar_1$ to $Ar_3$ may each be independently a phenylene group, a fluorenylene group, a phenanthrylene group, a pyridinylene group, or a phenylpyridinylene group, but are not limited thereto; and a, b, and c may each be independently 1, 2, 3, or 4, but are not limited thereto.

According to an embodiment, the polymer repeating unit represented by Formula 1 may be represented by Formula 1A-1 below, but is not limited thereto:

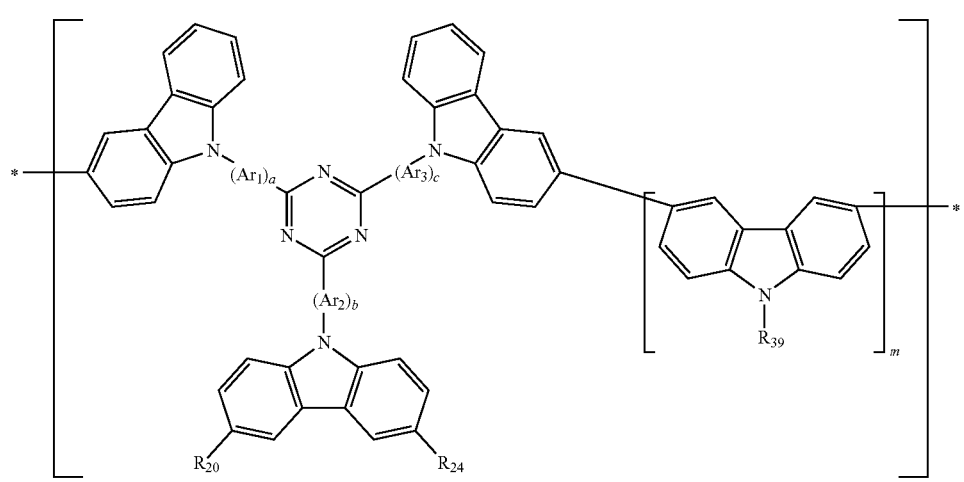

Formula 1A-1 wherein, in Formula 1A-1, $R_{20}$, $R_{24}$, $R_{39}$, $Ar_1$ to $Ar_3$, a, b, c, and m are the same as described above with reference to Formula 1.

For example, in Formula 1A-1, $R_{20}$, $R_{24}$ and $R_{39}$ may each be independently hydrogen, deuterium, a halogen atom, a hydroxyl group, a cyano group, a nitro group, a carboxyl group, a $C_1$-$C_{10}$ alkyl group, or a $C_1$-$C_{10}$ alkoxy group, but are not limited thereto; $Ar_1$ to $Ar_3$ may each be independently a substituted or unsubstituted phenylene group, a substituted or unsubstituted fluorenylene group, a substituted or unsubstituted phenanthrylene group, a substituted or unsubstituted pyridinylene group, or a substituted or unsubstituted phenylpyridinylene group, but are not limited thereto; a, b, and c may each be independently 1, 2, 3, or 4, but are not limited thereto; and m may be 0, 1 or 2, but is not limited thereto.

According to an embodiment, in Formula 1A-1, $R_{20}$ and $R_{24}$ may each be independently a $C_1$-$C_{10}$ alkyl group, but is not limited thereto; $R_{39}$ may be a $C_1$-$C_{10}$ alkoxy group, but is not limited thereto; $Ar_1$ to $Ar_3$ may each be independently a phenylene group, a fluorenylene group, a phenanthrylene group, a pyridinylene group, or a phenylpyridinylene group, but are not limited thereto; a, b, and c may each be independently 1, 2, 3, or 4, but are not limited thereto; and m may be 0, 1, or 2, but is not limited thereto.

In an embodiment, $R_1$ to $R_8$ in Formula 1 may all be identical to each other.

In another embodiment, $R_1$ to $R_8$ in Formula 1 may each be independently hydrogen, deuterium, a halogen atom, a hydroxyl group, a cyano group, a nitro group, a carboxyl group, a $C_1$-$C_{10}$ alkyl group, or a $C_1$-$C_{10}$ alkoxy group, but are not limited thereto.

A weight average molecular weight of the polymer comprising a repeating unit of Formula 1 may be about 2,000 Daltons to about 1,000,000 Daltons, based on polystyrene, but is not limited thereto, and a polydispersity index (PDI) of the polymer may be about 1.5 to about 5 but is not limited thereto. The weight average molecular weight and the PDI may be measured by, for example, gel permeation chromatography (GPC) based on polystyrene, and may be appropriately determined by further considering, for example, the desired structure and characteristics of an organic light-emitting device including the polymer.

As used herein, when a definition is not otherwise provided, the term "substituted X group" in the phrase "substituted or unsubstituted X group" (where X is a defined group), used herein refers to replacement of one or more hydrogen atoms of the X group with a substituent selected from deuterium, a halogen atom, a hydroxyl group, a nitro group, a cyano group, an amidino group, a hydrazinyl group, a carboxylic acid group or a salt thereof, a sulfonic acid group or a salt thereof, a phosphoric acid group or a salt thereof, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_1$-$C_{60}$ heteroaryl group, —$N(Q_{101})(Q_{102})$, —$Si(Q_{103})(Q_{104})(Q_{105})$, and a combination thereof, wherein $Q_{101}$ to $Q_{105}$ may each be independently hydrogen, a halogen, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_1$-$C_{60}$ heteroaryl group. If there are two or more substituents, the substituents may be identical to or different from each other.

For example, the term "substituted X group" indicates replacement of one or more hydrogen atoms of the X group with a substituent selected from deuterium, a halogen atom, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_6$-$C_{20}$ aryl group, a substituted or unsubstituted $C_1$-$C_{20}$ heteroaryl group, —$N(Q_{101})(Q_{102})$, —$Si(Q_{103})(Q_{104})(Q_{105})$, and a combination thereof, wherein $Q_{101}$ to $Q_{105}$ may each be independently hydrogen, a halogen, a hydroxyl group, a cyano group, a substituted or unsubstituted $C_1$-$C_{10}$ alkyl group, a substituted or unsubstituted $C_1$-$C_{10}$ alkoxy group, a substituted or unsubstituted $C_6$-$C_{20}$ aryl group, or a substituted or unsubstituted $C_1$-$C_{20}$ heteroaryl group.

As another example, the term "substituted X group" indicates replacement of one or more hydrogen atoms of the X group with a substituent selected from deuterium, a halogen atom, a hydroxyl group, a cyano group, a $C_1$-$C_{10}$ alkyl group, a $C_1$-$C_{10}$ alkoxy group, a $C_6$-$C_{20}$ aryl group, a $C_1$-$C_{20}$ heteroaryl group, —$N(Q_{101})(Q_{102})$, —$Si(Q_{103})(Q_{104})(Q_{105})$, and a combination thereof, wherein $Q_{101}$ to $Q_{105}$ may each be independently hydrogen, a halogen, a hydroxyl group, a cyano group, a $C_1$-$C_{10}$ alkyl group, a $C_1$-$C_{10}$ alkoxy group, a $C_6$-$C_{20}$ aryl group, or a $C_1$-$C_{20}$ heteroaryl group.

In still another example, the term "substituted X group" indicates replacement of one or more hydrogen atoms of the X group with a substituent selected from deuterium, a halogen atom, a hydroxyl group, a cyano group, a methyl group, an ethyl group, a propyl group, a butyl group, a pentyl group, a methoxy group, an ethoxy group, a propoxy group, a pentoxy group, a phenyl group, a naphthyl group, an anthryl group, and a combination thereof.

The "unsubstituted $C_1$-$C_{60}$ alkyl group" as used herein refers to a straight or branched chain saturated aliphatic hydrocarbyl group having the specified number of carbon atoms and a valence of one. Nonlimiting examples thereof include methyl, ethyl, propyl, isobutyl, sec-butyl, pentyl, isoamyl, hexyl, heptyl, octyl, and nonyl. The substituted $C_1$-$C_{60}$ alkyl group may be substituted with one or more substituents as described above where the term "substituted X group" is described in detail.

The term "unsubstituted $C_2$-$C_{60}$ alkenyl group" as used herein refers to a straight or branched chain hydrocarbyl group having the specified number of carbon atoms, a valence of one, and at least one carbon-carbon double blond at the center or at a terminal of the unsubstituted $C_2$-$C_{60}$ alkyl group. Nonlimiting examples of the unsubstituted $C_2$-$C_{60}$ alkenyl group are ethenyl, propenyl, butenyl, pentenyl, hexenyl, heptenyl, octenyl, propadienyl, isoprenyl, and allyl. The substituted $C_2$-$C_{60}$ alkenyl group may be substituted, where indicated, with one or more substituents described above where the term "substituted X group" is described in detail.

The term "unsubstituted $C_2$-$C_{60}$ alkynyl group" as used herein refers to a straight or branched chain hydrocarbon chain having the specified number of carbon atoms, a valence of one, and at least one carbon-carbon triple bond at the center or at a terminal of the unsubstituted $C_2$-$C_{60}$ alkyl group. Nonlimiting examples of the unsubstituted $C_2$-$C_{60}$ alkynyl group include acetylenyl, and the like. The substituted $C_2$-$C_{60}$ alkynyl group may be substituted, where indicated, with one or more substituents described above where the term "substituted X group" is described in detail.

The term "unsubstituted $C_1$-$C_{60}$ alkoxy group" as used herein has a formula represented by —OY where Y is the unsubstituted $C_1$-$C_{60}$ alkyl group as defined above. Nonlimiting examples of the unsubstituted $C_1$-$C_{60}$ alkoxy group include methoxy, ethoxy, isopropyloxy, butoxy, and pentoxy. The substituted $C_1$-$C_{60}$ alkoxy group may be substituted, where indicated, with one or more substituents described above where the term "substituted X group" is described in detail.

The term "unsubstituted $C_3$-$C_{60}$ cyclo alkyl group" as used herein refers to a hydrocarbyl group having one or more cyclic saturated rings in which all ring members are carbon, the specified number of carbon atoms, and a valence of one. Nonlimiting examples of the unsubstituted $C_3$-$C_{60}$ cyclo alkyl group include cyclopropyl, cyclobutyl, cyclopentyl, cyclohexyl, cycloheptyl, cyclooctyl, and adamantyl groups. The substituted $C_1$-$C_{60}$ cycloalkyl group may be substituted, where indicated, with one or more substituents described above where the term "substituted X group" is described in detail.

The term "unsubstituted $C_3$-$C_{60}$ cycloalkenyl group" as used herein refers to a cycloalkyl group having at least one carbon-carbon double bond in the ring. Nonlimiting examples of the unsubstituted $C_3$-$C_{60}$ cyclo alkenyl group include cyclopropenyl, cyclobutenyl, cyclopentenyl, cyclohexenyl, cycloheptenyl, 1,3-cyclohexadienyl, 1,4-cyclohexadienyl, 2,4-cycloheptadienyl, and 1,5-cyclooctadienyl. A "$C_3$-$C_{60}$ cycloalkynyl" group is a cycloalkyl group having at least one carbon-carbon triple bond in the ring. The cycloalkenyl and cycloalkynyl groups do not contain an aromatic ring or a heterocyclic ring. The substituted $C_3$-$C_{60}$ cyclo alkenyl and cycloalkynyl groups may be substituted, where indicated, with one or more substituents described above where the term "substituted X group" is described in detail.

The term "unsubstituted $C_3$-$C_{60}$ alkylene" group refers to an alkyl group having the specified number of carbon atoms, a valence of two or higher, and may be optionally substituted, where indicated, with one or more substituents described above where the term "substituted X group" is described in detail.

The term "unsubstituted $C_6$-$C_{60}$ aryl group" as used herein refers to a monovalent group having a carbocyclic aromatic system in which the number of carbon atoms is 6 to 60, and may be a monocyclic group or a polycyclic group. If the unsubstituted $C_6$-$C_{60}$ aryl group is a polycyclic group, two or more ring may be present, and any additional rings may be independently aromatic, saturated, or partially unsaturated and multiple rings, if present, may be fused, pendent, spirocyclic or a combination thereof. Nonlimiting examples of the unsubstituted $C_6$-$C_{60}$ aryl group include phenyl, pentalenyl, indenyl, naphthyl, azulenyl, heptalenyl, indacenyl, acenaphthyl, fluorenyl, spiro-fluorenyl, phenalenyl, phenanthryl, anthryl, fluoranthenyl, triphenylenyl, pyrenyl, chrysenyl, naphthacenyl, picenyl, perylenyl, pentaphenyl, hexacenyl, and tetrahydronaphthyl groups. The substituted $C_6$-$C_{60}$ aryl group may be one or more substituents described above where the term "substituted X group" is described in detail.

The term "unsubstituted $C_6$-$C_{60}$ arylene group" as used herein refers to a divalent group having a carbocyclic aromatic system in which the specified number of carbon atoms is 6 to 60, wherein the points of attachment may be on the same or different rings, each of which rings may be aromatic or nonaromatic. Nonlimiting examples of the unsubstituted $C_6$-$C_{60}$ arylene group include phenylene and naphthylene. The substituted $C_6$-$C_{60}$ arylene group may be substituted with one or more substituents described above where the term "substituted X group" is described in detail.

The term "unsubstituted $C_6$-$C_{60}$ aryloxy" group" as used herein has a formula represented by —OY where Y is the unsubstituted $C_1$-$C_{60}$ aryl group as defined above. Nonlimiting examples of the unsubstituted $C_1$-$C_{60}$ alkoxy group include phenoxy. The substituted $C_6$-$C_{60}$ arylalkoxy group may be substituted, where indicated, with one or more substituents described above where the term "substituted X group" is described in detail.

The term "unsubstituted $C_6$-$C_{60}$ arylthio" group" as used herein has a formula represented by —SY where Y is the unsubstituted $C_1$-$C_{60}$ aryl group as defined above. The substituted $C_6$-$C_{60}$ arylalkoxy group may be substituted, where indicated, with one or more substituents described above where the term "substituted X group" is described in detail.

The term "unsubstituted $C_1$-$C_{60}$ heteroaryl group" as used herein refers to a monocyclic or polycyclic group, each having at least one ring having one or more heteroatoms in the ring independently selected from nitrogen (N), oxygen (O), phosphorous (P), sulfur (S), and a combination thereof. If the unsubstituted $C_2$-$C_{60}$ hetero aryl group is a polycyclic group, two or more rings contained in the unsubstituted $C_2$-$C_{60}$ heteroaryl group may be present, and any additional rings may be independently aromatic, saturated, or partially unsaturated and multiple rings, if present, may be fused, pendent, spirocyclic or a combination thereof. Nonlimiting examples of the unsubstituted $C_2$-$C_{60}$ heteroaryl group include pyrrolyl, imidazolyl, pyrazolyl, pyridinyl, pyrazinyl, pyrimidinyl, pyridazinyl, isoindolyl, indolyl, indazolyl, purinyl, quinolinyl, benzoquinolinyl, phthalazinyl, naphthyridinyl, quinoxalinyl, quinazolinyl, cinnolinyl, carbazolyl, phenanthridinyl, acridinyl, phenanthrolinyl, phenazinyl, benzooxazolyl, benzoimidazolyl, furanyl, benzofuranyl, thiophenyl, benzothiophenyl, thiazolyl, isothiazolyl, benzothiazolyl, isoxazolyl, oxazolyl, triazolyl, tetrazolyl, oxadiazolyl, triazinyl, and benzooxazolyl. The substituted $C_6$-$C_{60}$ heteroaryl group may be substituted with one or more substituents described above where the term "substituted X group" is described in detail.

The term "unsubstituted $C_6$-$C_{60}$ heteroarylene group" as used herein refers to a divalent monocyclic or polycyclic group having at least one ring having one or more hetero atoms in the ring independently selected from nitrogen (N), oxygen (O), phosphorous (P), and sulfur (S). Nonlimiting examples of the unsubstituted $C_6$-$C_{60}$ heteroarylene group may be understood by referring to the examples of the unsubstituted $C_6$-$C_{60}$ heteroaryl group above. The substituted $C_6$-$C_{60}$ heteroarylene group may be substituted with one or more substituents described above where the term "substituted X group" is described in detail.

The expression "*" used herein refers to a binding site with an adjacent moiety, including for example, a point of attachment of each repeat unit of a polymer.

According to an embodiment, the polymer including the repeating unit represented by Formula 1 may be synthesized using a known organic synthesis method, for example, Suzuki coupling or Yamamoto coupling. The synthesis methods are known to one of ordinary skill in the art with reference to examples which will be presented later.

Figure 6:
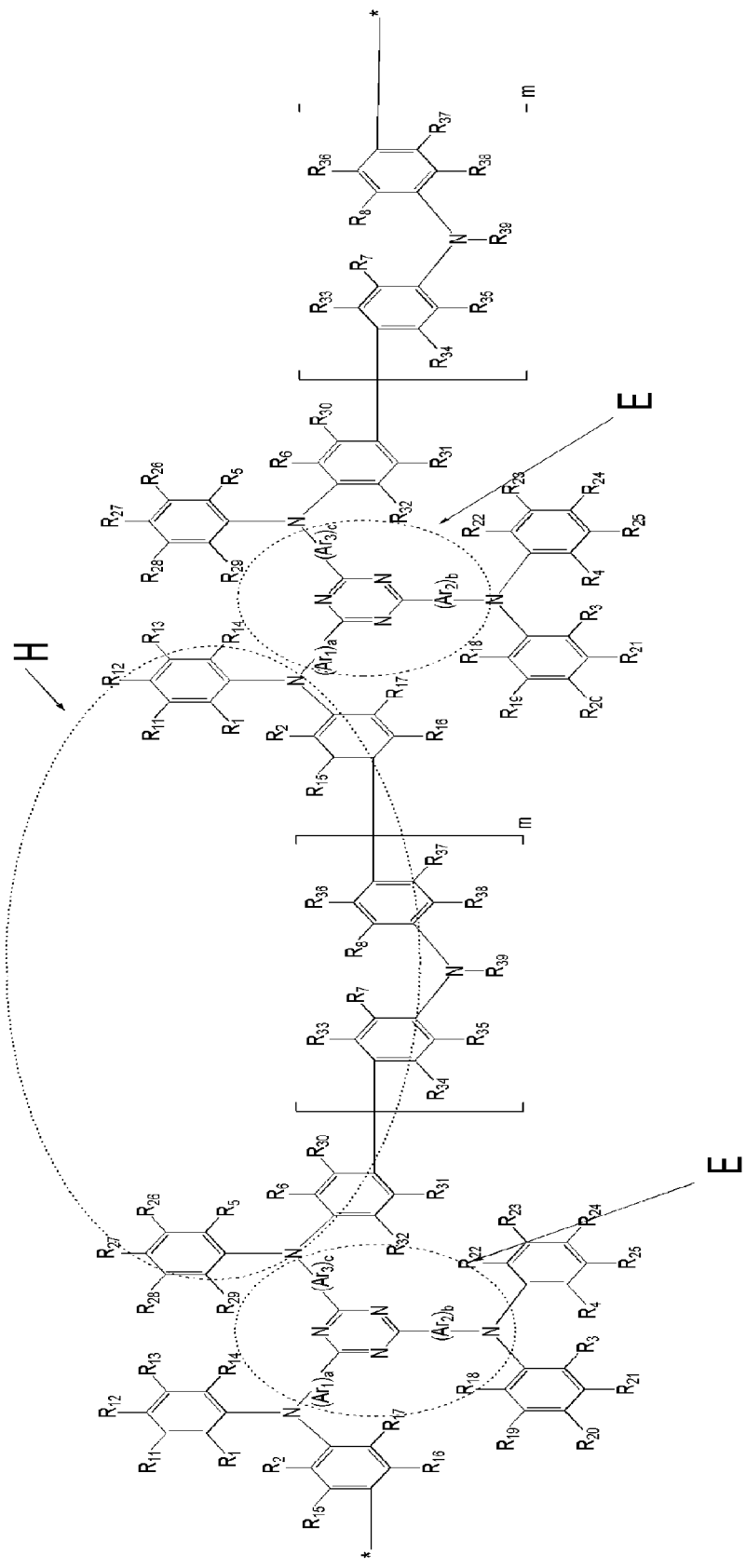
FIG. 6 shows Formula 1-2.

The polymer having the repeating unit represented by Formula 1 is a bipolar polymer having an electron transporting part represented by E and a hole transporting part represented by H in a main backbone, as illustrated in Formula 1-2 shown in FIG. 6, wherein the variables have the same definitions as described above in Formula 1. The polymer of Formula 1-2 is formed by connecting two of the repeating units represented by Formula 1. Due to the inclusion of the electron transporting part and the hole transporting part, a balance between hole transport and electron transport may be effectively made and maintained.

Also, without being bound by theory, linking between positions 3 and 6 in benzene rings of the hole transporting part H may contribute to maintenance of an energy band gap (Eg) and triplet energy ($E_T$) at high levels even when a conjugation length of the polymer is increased.

Also, since a conjugation length of the polymer may be easily adjusted by controlling the variable m, in the polymer, hole and electron injection and transport characteristics of the polymer may be optimized according to a moiety of the hole transporting part H.

Accordingly, the polymer comprising unites represented by Formula 1, may be used in an organic light-emitting device, for example, as a phosphorescent host, which is used together with a phosphorescent dopant in an emitting layer of an organic light-emitting device.

Unlike a fluorescent material having a maximum internal quantum efficiency of 25% in which only singlet state energy contributes to light-emission, a phosphorescent material that enables intersystem crossing between singlet state energy and triplet state energy has, in theory, a maximum internal quantum efficiency of 100% since excitons having triplet state energy also contribute to light-emission. Accordingly, an organic light-emitting device including a phosphorescent material has high efficiency. If a high level of triplet state energy of a known phosphorescent dopant and characteristics of the polymer described above are taken into consideration, the polymer is suitable for use as a phosphorescent host in an emitting layer of an organic light-emitting device.

For example, the polymer may be used as a red, green, and/or blue phosphorescent host in an emitting layer of an organic light-emitting device. According to an embodiment, the polymer may be used as a red and/or green phosphorescent host in an emitting layer of an organic light-emitting device, but is not limited thereto.

Accordingly, provided is an organic light-emitting device including a substrate; a first electrode; a second electrode; and a first layer that is disposed between the first electrode and the second electrode and includes the polymer including the repeating unit represented by Formula 1.

The first layer of the organic light-emitting device may function, for example, as an emitting layer.

If the first layer is an emitting layer, the first layer may further include a phosphorescent dopant. The phosphorescent dopant may be any one of known phosphorescent dopants. For example, the phosphorescent dopant may be an organometallic complex including iridium (Ir), platinum (Pt), osmium (Os), rhenium (Re), titanium (Ti), zirconium (Zr), hafnium (Hf), or a combination thereof, but is not limited thereto.

Nonlimiting examples of the phosphorescent dopant include the metallic compound coupled to a combination of groups selected from a substituted or unsubstituted acetylacetonate group, a substituted or unsubstituted heteroaryl(heteroaryl) group, a substituted or unsubstituted biaryl(heteroaryl) group, a substituted or unsubstituted biheteroaryl group, a substituted or unsubstituted aryl(heterocycloalkyl) group, a substituted or unsubstituted aryl(heteroaryl) group, a substituted or unsubstituted alkylporphyrin group, a substituted or unsubstituted arylisoquinoline group, a substituted or unsubstituted arylquinoline group, a substituted or unsubstituted picolinate group, a substituted or unsubstituted heterocycloalkyl(heteroaryl) group, and the like. More specifically, nonlimiting examples of the phosphorescent dopant include bisthienylpyridine acetylacetonate iridium, bis(benzothienylpyridine)acetylacetonate iridium, bis(2-phenylbenzothiazole)acetylacetonate iridium, bis(1-phenylisoquinoline) iridium acetylacetonate, tris(1-phenylisoquinoline) iridium, tris (phenylpyridine) iridium, tris(2-biphenylpyridine) iridium, tris(3-biphenylpyridine) iridium, tris(4-biphenylpyridine) iridium, Pq$_2$Ir(acac) where pq is an abbreviation of 2-phenylquinoline and acac is an abbreviation of acetylacetone (Compound 10), Ir(ppy)$_3$ where ppy is an abbreviation of phenylpyridine (Compound 11), Ir(2',6'-difluoro-2,3'-bipyridine)$_3$ (Compound 12), Firpic (Bis(4,6-difluorophenylpyridinato-N,C2)picolinatoiridium) (Compound 13), Ir (piq)$_2$acac where piq is an abbreviation of phenylisoquinoline (Compound 14), Ir(mppy)$_3$ where mppy is an abbreviation of methylphenylpyridine (see Compound 15 blow), platinum(II)octaethylporphyrin (PtOEP) (Compound 16), Ir(piq)$_3$ (Compound 17), Btp$_2$Ir(acac) where Btp is an abbreviation of benzothienylpyridine (Compound 18), F$_2$Irpic (bis[2-(4,6-difluorophenyl)pyridinato-N,C2']iridium picolinate) (Compound 19 (F$_2$ ppy)$_2$Ir(tmd) where tmd is an abbreviation of tetramethyldione (Compound 20), Ir(dfppz)$_3$ (tris[1-(4,6-difluorophenyl)pyrazolate-N,C2']iridium) (Compound 21), and a combination thereof:

Compound 10

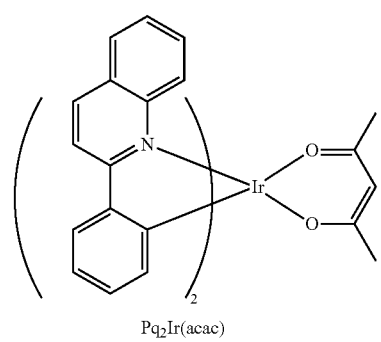

Pq$_2$Ir(acac)

Compound 11

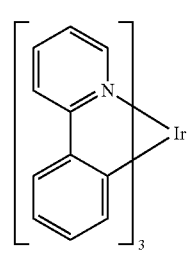

Compound 12

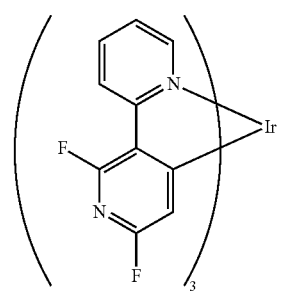

Compound 13

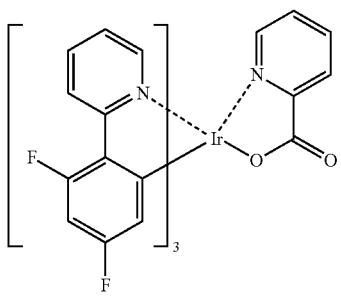

Compound 14

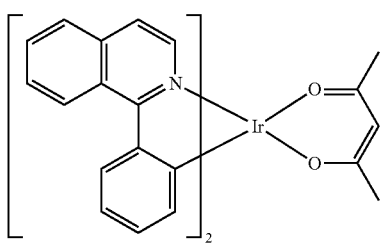

Compound 15

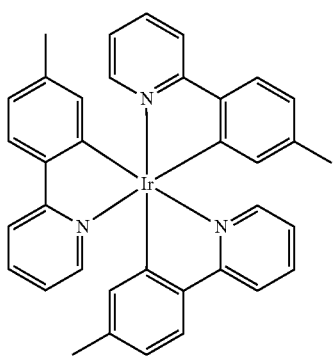

Compound 16

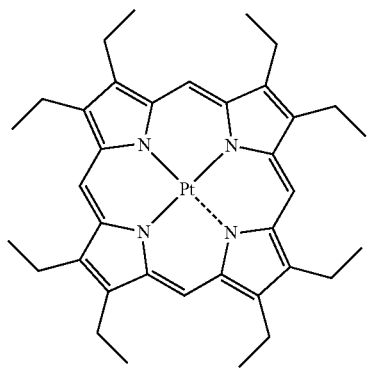

PtOEP

Compound 17

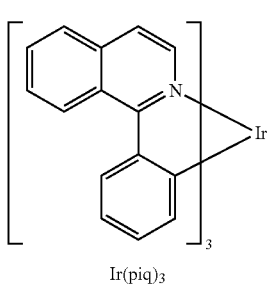

Ir(piq)₃

Compound 18

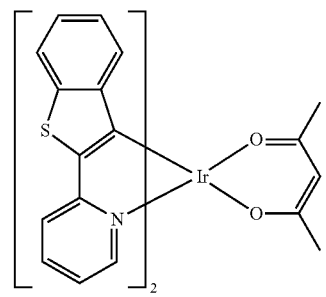

Btp₂Ir(acac)

Compound 19

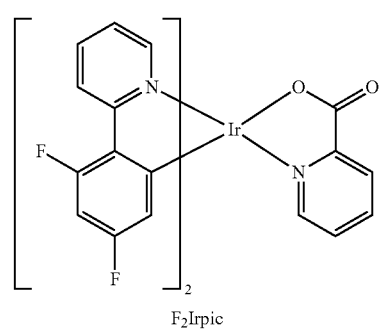

F₂Irpic

Compound 20

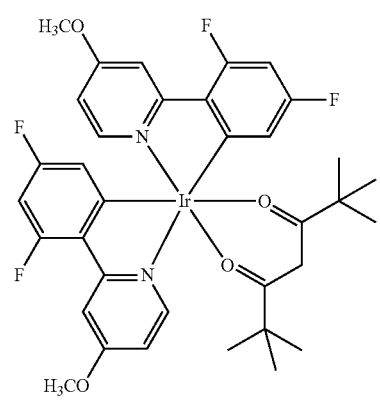

(F₂ppy)₂Ir(tmd)

Compound 21

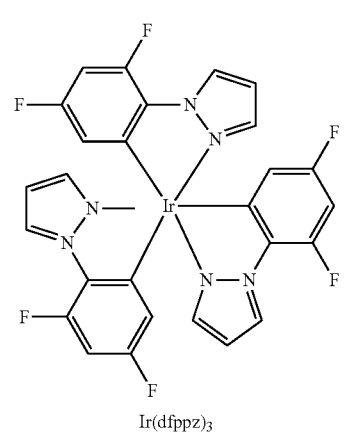

Ir(dfppz)₃

In addition to the first layer (functioning as, for example, an emitting layer), a hole injection layer, a hole transport layer, a hole blocking layer, an electron transport layer, an electron injection layer, or any combination thereof may be further disposed between the first electrode and the second electrode of the organic light-emitting device.

FIG. 1 is a schematic sectional view of an organic light-emitting device 10 according to an embodiment. The organic light-emitting device 10 includes a substrate 11, a first electrode 12, a hole transport layer 13, a first layer 15, an electron transport layer 16, an electron injection layer 18, and a second electrode 19. The first layer 15 may function as an emitting layer. The organic light-emitting device 10 and a method of manufacturing the organic light-emitting device 10 will now be described in detail.

First, a first electrode material having a high work function may be disposed, deposited, ion-plated, plated, or sputtered on the substrate 11 to form the first electrode 12. The first electrode 12 may be an anode through which holes are injected or a cathode through which electrons are injected. The substrate 11 may be any one of various substrates that are used in a known organic light-emitting device, and may be a glass substrate or a transparent plastic substrate having excellent mechanical strength, thermal stability, transparency, surface smoothness, ease of handling, and water repellence. The first electrode material may be a metal oxide, a metal sulfide, or a metal, each of which has high electrical conductivity, and in general, these materials may be used as a thin film. The first electrode material may also be a polyaryl based or polyheteroaryl based material. More specifically, nonlimiting examples of the first electrode material include an oxide such as an indium oxide, a zinc oxide, a tin oxide, an indium tin oxide (ITO), or an indium zinc oxide (IZO), gold, platinum, silver, and copper. The first electrode material may also be polyaniline or a derivative thereof, polythiophene or a derivative thereof, and the like. The first electrode 12 may have a one-layer structure or a multi-layer structure including two or more layers, and may include two or more different materials. A thickness of the first electrode 12 may be appropriately controlled by considering transmissivity of light and electrical conductivity, and may be, for example, about 10 nanometers (nm) to about 10 micrometers (μm).

Although not illustrated in FIG. 1, according to another embodiment, if the first electrode 12 is an anode, a hole injection layer may be further disposed, e.g., formed on the first electrode 12. The hole injection layer may be disposed, e.g., formed on the first electrode 12 by using any one of various methods, for example, vacuum deposition, spin coating, casting, or Langmuir-Blodgett (LB) deposition.

When the hole injection layer is formed on the first electrode 12 by vacuum deposition, the deposition conditions may vary according to a material that is used to form the hole injection layer, and the structure and thermal characteristics of the hole injection layer. For example, the deposition conditions may include a deposition temperature of about 100° C. to about 500° C., a vacuum pressure of about $10^{-8}$ torr to about $10^{-3}$ torr, and a deposition rate of about 0.01 Angstrom/second to about 100 Angstrom/second.

When the hole injection layer is formed on the first electrode 12 using spin coating, coating conditions may vary according to the material used to form the hole injection layer, and the structure and thermal properties of the hole injection layer. For example, the coating conditions may include a coating speed of about 2000 revolutions per minute (rpm) to about 5000 rpm, and a heat treatment temperature of about 80° C. to about 300° C., wherein the heat treatment serves to remove the solvent after coating.

A material that is used to form the hole injection layer may be any one of known hole injecting materials. Nonlimiting examples of the material include a substituted or unsubstituted phthalocyanine compound, a substituted or unsubstituted bis(triarylamino) compound, an amino group coupled to at least one substituted or unsubstituted triarylamino group, and the like. More specifically, nonlimiting examples of the material include copper phthalocyanine, 4,4',4"-tris(3-methylphenylphenylamino)triphenylamine (m-MTDATA) whose formula is presented below, N,N'-di(1-naphthyl)-N,N'-diphenylbenzidine (NPB), $N^1,N^1$-bis(4-(diphenylamino)phenyl)-$N^4,N^4$-diphenylbenzene-1,4-diamine (TDATA) whose formula is presented below, $N^1$-(naphthalen-2-yl)-$N^4,N^4$-bis(4-(naphthalen-2-yl(phenyl)amino)phenyl)-$N^1$-phenylbenzene-1,4-diamine (2T-NATA) having the formula below, and the like.

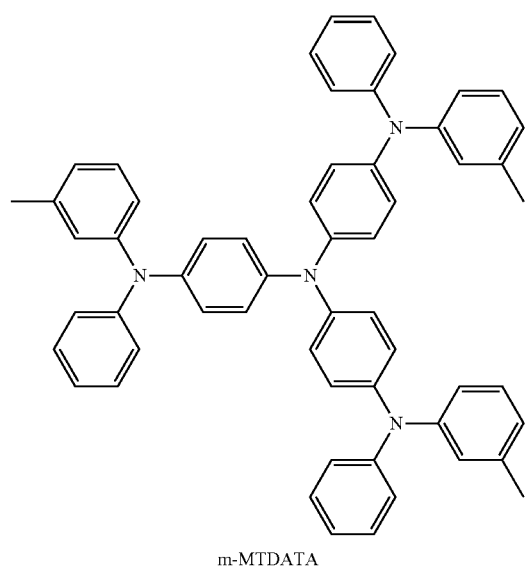

m-MTDATA

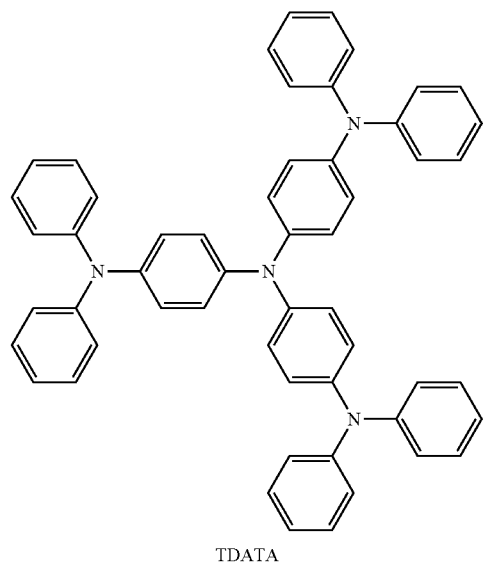

TDATA

-continued

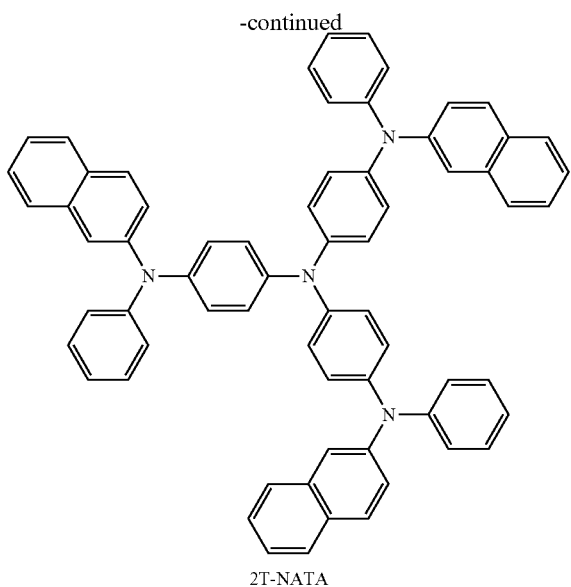

2T-NATA

The hole injection layer may have a thickness of about 100 nm to about 10000 nm. More specifically the hole injection layer may have, for example, a thickness of about 100 nm to about 1000 nm. When the thickness of the hole injection layer is within these ranges, the hole injection layer may have good hole injection characteristics without an increase in driving voltage.

The hole transport layer 13 may be disposed, e.g., formed on the first electrode 12 or the hole injection layer by vacuum deposition, spin coating, casting, LB deposition, and the like.

When the hole transport layer 13 is disposed, e.g., formed on the first electrode 12 by vacuum deposition or spin coating, the deposition or coating conditions may be similar to those applied to form the hole injection layer, although the deposition or coating conditions may vary according to the material that is used to form the hole transport layer.

A material that is used to form the hole transport layer 13 may be any one of known hole transport materials. Nonlimiting examples of the material that is used to form the hole transport layer 13 include a substituted or unsubstituted bis (triarylamino) based compound, a substituted or unsubstituted polyaniline/substituted or unsubstituted arylsulfonic acid group, a substituted or unsubstituted polyaniline/substituted or unsubstituted cycloalkylsulfonic acid group wherein the cycloalkyl group may be a substituted or unsubstituted bridged cycloalkyl group, a substituted or unsubstituted polyaniline/substituted or unsubstituted polystyrenesulfonic acid group, a substituted or unsubstituted polyheteroaryl/substituted or unsubstituted polystyrenesulfonic acid group and the like. More specifically, nonlimiting examples of the material that is used to form the hole transport layer 13 include N,N'-bis(3-methylphenyl)-N,N'-diphenyl-[1,1-biphenyl]-4,4'-diamine (TPD) whose formula is presented below, polyaniline/dodecylbenzenesulfonic acid (Pani/DBSA) a polymer with a repeating unit represented by the formula below, poly (3,4-ethylenedioxythiophene)/poly(4-styrenesulfonate) (PEDOT/PSS) a polymer with a repeating unit represented by the formula below, polyaniline/camphor sulfonic acid (Pani/CSA) a polymer with a repeating unit represented by the formula below, polyaniline/poly(4-styrenesulfonate) (Pani/PSS) a polymer with a repeating unit represented by the formula below, and the like.

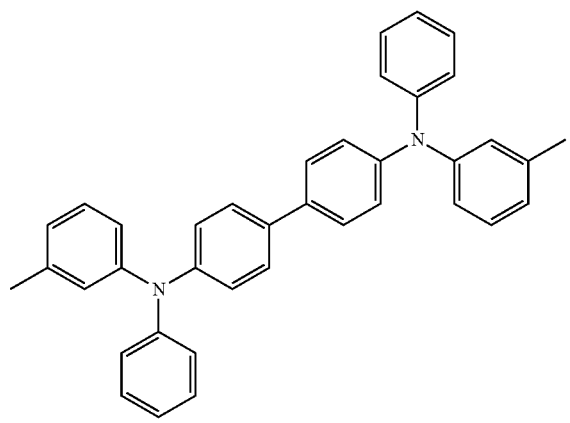

TPD

-continued
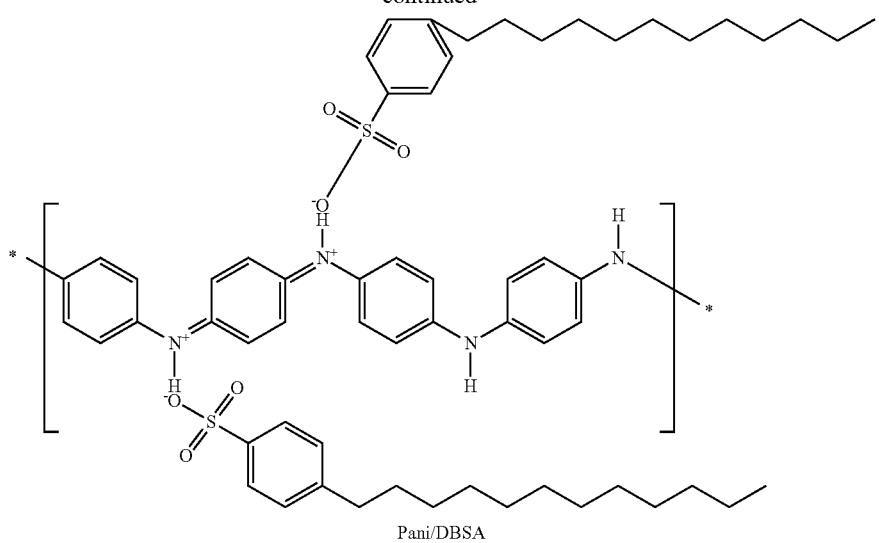
Pani/DBSA
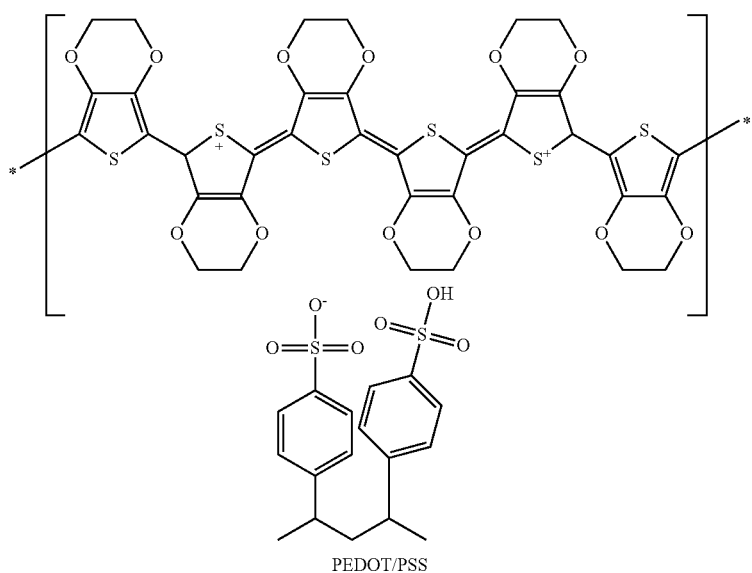
PEDOT/PSS
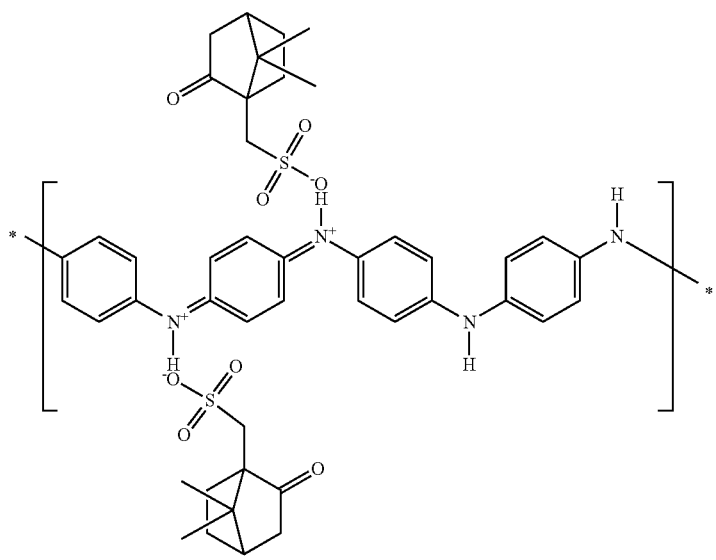
Pani/CSA

-continued

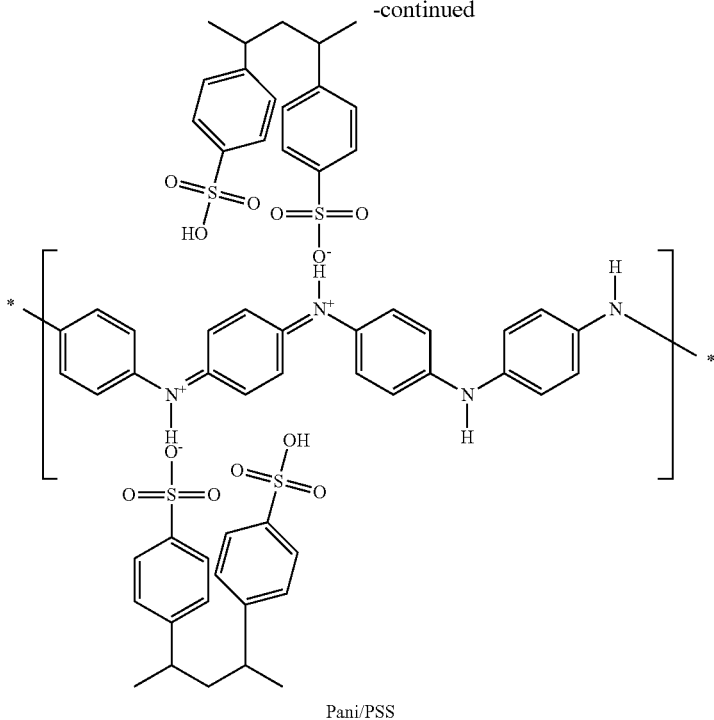

Pani/PSS

The hole transport layer 13 may have a thickness of about 50 nm to about 1000 nm. More specifically, the hole transport layer 13 may have, for example, a thickness of about 100 nm to about 600 nm. When the thickness of the hole transport layer 13 is within the above range, the hole transport layer 13 may have excellent hole transport characteristics without an increase in driving voltage.

The first layer 15 that may function as an emitting layer, may be disposed on the hole transport layer 13. The first layer 15 may be disposed on the hole transport layer 13 by spin coating, casting, LB deposition, and the like. If the first layer 15 is disposed on the hole transport layer 13 by spin coating, the coating conditions may be similar to those used to dispose the hole injection layer on the first electrode 12, although the coating conditions may vary according to the polymer and/or compound that is used to form the first layer 15.

The first layer 15 may include the polymer having the repeating unit represented by Formula 1 as a host. Also, the first layer 15 may further include a phosphorescent dopant, in addition to the polymer having the repeating unit represented by Formula 1. Examples of the phosphorescent dopant have already been described above.

If the first layer 15 includes the polymer having the repeating unit represented by Formula 1 and a phosphorescent dopant, an amount of the phosphorescent dopant contained in the first layer 15 may be about 1 wt. % to about 10 wt. % based on 100 wt. % of the total weight of the first layer 15. If the amount of the phosphorescent dopant is within the ranges described above, concentration quenching may be substantially prevented.

The first layer 15 may include only the polymer having the repeating unit represented by Formula 1. Alternatively, the first layer 15 may include the polymer having the repeating unit represented by Formula 1 and a known fluorescent dopant, but is not limited thereto.

A thickness of the first layer 15 that functions as an emitting layer may be about 100 nm to about 1000 nm, and more specifically, about 200 nm to about 900 nm. If the thickness of the first layer 15 is within these ranges, the first layer 15 may have good light-emitting characteristics without an increase in driving voltage.

Although not illustrated in FIG. 1, according to another embodiment, a hole blocking layer may be further disposed on the first layer 15.

The hole blocking layer may prevent diffusion of triplet excitons or holes in the first layer 15 that functions as an emitting layer to the second electrode 19. The hole blocking layer may be disposed, e.g., formed on the first layer 15 by vacuum deposition, spin coating, casting, LB deposition, and the like. If the hole blocking layer is formed on the first layer 15 by vacuum deposition or spin coating, the deposition or coating conditions may be similar to those applied to form the hole injection layer on the first electrode 12, although the deposition or coating conditions may vary according to the material that is used to form the hole blocking layer. Nonlimiting examples of a known hole blocking material include an oxadiazole derivative, a triazole derivative, a phenanthroline derivative, a pyridazine derivative, and the like. More specifically, nonlimiting examples of a known hole blocking material include pyridazino[1,2-a]cinnoline whose formula is presented below, and 4-(naphthalen-1-yl)-3,5-diphenyl-4H-1,2,4-triazole (TAZ) whose formula is presented below, and the like.

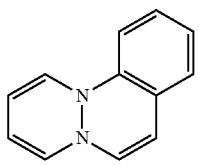

pyridazino[1,2-a]cinnoline

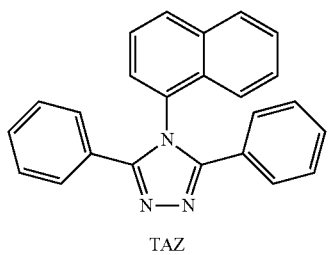
TAZ

A thickness of the hole blocking layer may be about 50 nm to about 1000 nm, and more specifically, about 100 nm to about 300 nm. If the thickness of the hole blocking layer is within these ranges, the hole blocking layer may have satisfactory hole blocking characteristics.

Next, the electron transport layer 16 is disposed on the first layer 15 or the hole blocking layer, by vacuum deposition, spin coating, casting, and the like. If the electron transport layer 16 is disposed on the first layer 15 by vacuum deposition or spin coating, the deposition or coating conditions may be similar to those applied to dispose the hole injection layer on the first electrode 12, although the deposition or coating conditions may vary according to the material that is used to form the electron transport layer 16. A material that is used to form the electron transport layer 16 may be a material that stably transports electrons injected through an electrode injection electrode (cathode). Nonlimiting examples of the material that is used to form the electron transport layer 16 include a substituted or unsubstituted phenanthroline compound; a substituted or unsubstituted benzoimidazole compound; a metallic compound coupled via an ether linkage to a combination of groups selected from a substituted or unsubstituted quinoline group, a substituted or unsubstituted biaryl group, and a substituted or unsubstituted benzoquinoline group; and the like. More specifically, nonlimiting examples of the material that is used to form the electron transport layer include 4,7-diphenyl-1,10-phenanthroline (Bphen), BAlq where B is an abbreviation of biphenyl and q is an abbreviation of a quinoline group whose formula is presented below, tris(8-quinolinorate)aluminum (Alq3), beryllium bis(benzoquinolin-10-olate) (Bebq$_2$), 1,3,5-tris(1-phenyl-1H-benzo[d]imidazol-2-yl)benzene (TPBi) whose formula is presented below, and the like.

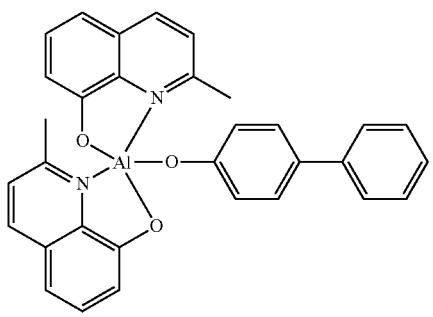
BAlq

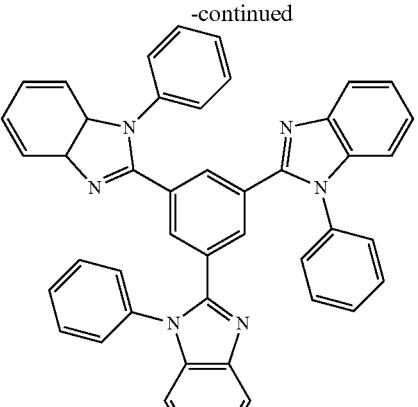
TPBi

The electron transport layer 16 may have a thickness of about 100 nm to about 1,000 nm, and more specifically, about 200 nm to about 500 nm. If the thickness of the electron transport layer 16 is within these ranges, the electron transport layer 16 may have good electron transport characteristics without an increase in driving voltage.

Subsequently, the electron injection layer 18 may be disposed on the electron transport layer 16. A material that is used to form the electron injection layer 18 may be any one of known materials that are used to form an electron injection layer, and may be a metal halide or a metal oxide. More specifically, nonlimiting examples of the material used to form the electron injection layer 18 include lithium fluoride (LiF), sodium chloride (NaCl), cesium fluoride (CsF), lithium oxide (Li$_2$O), barium oxide (BaO), or barium fluoride (BaF$_2$). The deposition conditions may be similar to those applied to dispose the hole injection layer on the first electrode 12, although the deposition conditions may vary according to the material that is used to form the electron injection layer 18.

The electron injection layer 18 may have a thickness of about 1 nm to 100 nm, and more specifically, about 5 nm to about 50 nm. When the thickness of the electron injection layer 18 is within these ranges, the electron injection layer 18 may have good electron injection characteristics without an increase in driving voltage.

Finally, the second electrode 19 may be disposed, e.g., formed on the electron injection layer 18. A method of forming the second electrode 19 on the electron injection layer 18 may be understood by referring to the method of forming the first electrode 12 on the substrate 11 as described above. The second electrode 19 may be used as a cathode or an anode. If the second electrode 19 is used as a cathode, the second electrode 19 may be formed of a material having a low work function. Nonlimiting examples of the low work function material include graphite; a graphite interlayer compound; an alkali metal, an alkali earth metal, and a metal; an alloy comprising at least two elements selected from an alkali metal, an alkali earth metal and a metal; and an alloy comprising at least one alkali metal, an alkali earth metal, and a metal, and at least one transition metal, an actinide and a poor metal element. More specifically, nonlimiting examples of the low work function material include lithium; sodium; potassium; rubidium; cesium; beryllium; magnesium; calcium; strontium; barium; aluminum; scandium; vanadium; zinc; yttrium; indium; cerium; samarium; europium; terbium; ytterbium; an alloy comprising at least two elements selected from lithium, sodium, potassium, rubidium, cesium, beryllium, magnesium, calcium, strontium, barium, aluminum, scandium, vanadium, zinc, yttrium, indium, cerium, samarium, europium, terbium, and ytterbium; an alloy comprising at least one element selected from lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, and at least one element selected from gold, silver, plutonium, copper, manganese, titanium, cobalt, nickel, tungsten, and tin; graphite; a graphite interlayer compound; and the like. More specific nonlimiting examples of the alloys include a magnesium-silver alloy, a magnesium-indium alloy, a magnesium-aluminum alloy, an indium-silver alloy, a lithium-aluminum alloy, a lithium-magnesium alloy, a lithium-indium alloy, and a calcium-aluminum alloy. Also, the second electrode 19 may have a one-layer structure or a multi-layer structure. Also, the second electrode 19 may include only one kind of material, or two or more different materials. The second electrode 19 may be a transparent, semi-transparent, or reflective electrode. A thickness of the second electrode 19 may be, for example, about 10 nm to about 10 μm, but is not limited thereto.

One or more embodiments will now be described in further detail with reference to the following examples. These examples are for illustrative purposes only and are not intended to limit the scope of the one or more embodiments.

Synthesis Example 1

Synthesis of Compound 1

Compound 1 was synthesized according to Reaction Scheme 1 below.

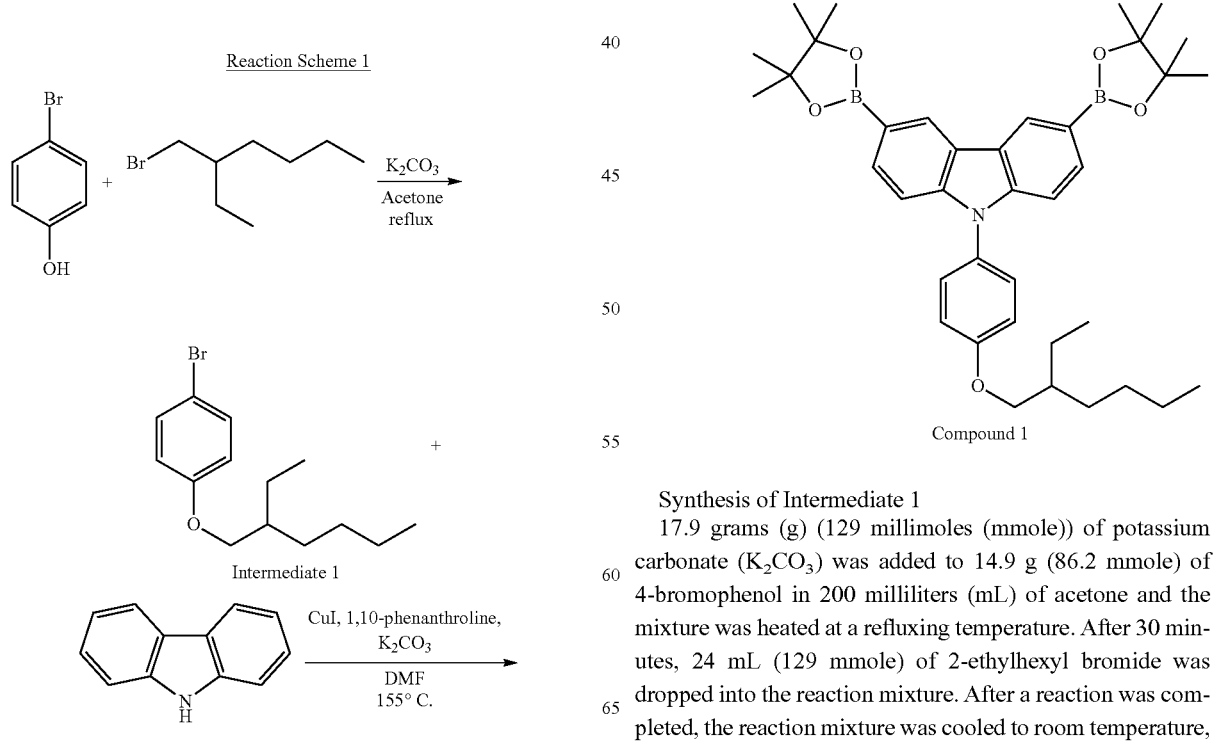

Synthesis of Intermediate 1

17.9 grams (g) (129 millimoles (mmole)) of potassium carbonate ($K_2CO_3$) was added to 14.9 g (86.2 mmole) of 4-bromophenol in 200 milliliters (mL) of acetone and the mixture was heated at a refluxing temperature. After 30 minutes, 24 mL (129 mmole) of 2-ethylhexyl bromide was dropped into the reaction mixture. After a reaction was completed, the reaction mixture was cooled to room temperature, washed with brine, extracted with methylene chloride (CH$_2$Cl$_2$), dried with anhydrous magnesium sulfate (MgSO$_4$), filtered, and concentrated under reduced pressure. The residual was refined by using column chromatography to obtain 23.3 g of Intermediate 1 (1-bromo-4-((2-ethylhexyl)oxy)benzene) (Yield: 97%).

$^1$H-NMR (deuterated chloroform (CDCl$_3$), 300 MegaHertz (MHz)): δ 7.40-7.37 (d, 2H), 6.82, 6.79 (d, 2H), 3.84-3.82 (d, 2H), 1.74 (m, 1H), 1.57-1.34 (m, 10H), 0.98-0.84 (m, 6H)

$^{13}$C-NMR (CDCl$_3$, 75 MHz): δ 158.5, 132.1, 116.3, 112.4, 70.7, 39.3, 30.5, 28.8, 25.1, 23.8, 14.1, 11.6

Synthesis of Intermediate 2

In a nitrogen atmosphere, 16.8 g (49.2 mmole) of Intermediate 1 in 20 mL of dimethylformamide (DMF) was dropped into 8.6 g (49.2 mmole) of carbazole, 281 milligrams (mg) (1.5 mmole) of copper iodide (CuI), 541 mg (3.0 mmole) of 1,10-phenanthroline, and 13.6 g (98.4 mmole) of K$_2$CO$_3$ in 100 mL of DMF, and the mixture was heated at a temperature of 155° C. and stirred for 24 hours. After a reaction was completed, the reaction mixture was filtered with a celite pad, and washed with CH$_2$Cl$_2$. The filtrate was washed with brine and dried with anhydrous MgSO$_4$, filtered, and concentrated under reduced pressure. The residual was refined by using column chromatography to obtain 12.2 g of Intermediate 2 (9-(4-((2-ethylhexyl)oxy)phenyl)-9H-carbazole) (67%).

$^1$H-NMR (CDCl$_3$, 300 MHz): δ 8.17 (d, 2H), 7.49-7.12 (m, 8H), 7.11 (d, 2H), 3.99 (d, 2H), 1.86-1.82 (m, 1H), 1.80-1.42 (m, 8H), 1.08-0.94 (m, 6H)

$^{13}$C-NMR (CDCl$_3$, 75 MHz): δ 158.7, 141.4, 130.0, 128.5, 125.8, 123.0, 120.2, 119.6, 115.6, 109.7, 70.8, 39.4, 30.6, 29.1, 23.9, 23.1, 14.1, 11.1

Synthesis of Intermediate 3

7.7 g (43 mL) of N-bromosuccinimide (NBS) was dropped into 8.0 g (21.5 mmole) of Intermediate 2 in 50 mL of a mixture including (chloroform) CHCl$_3$ and DMF (a volumetric ratio of CHCl$_3$ to DMF was 3:1), and a reaction was performed at room temperature. After the reaction was completed, the reaction mixture was washed with brine, extracted with CH$_2$Cl$_2$, dried with anhydrous MgSO$_4$, filtered, and concentrated under reduced pressure. The residual was refined by using column chromatography to obtain 10.4 g of Intermediate 3 (3,6-dibromo-9-(4-((2-ethylhexyl)oxy)phenyl)-9H-carbazole) (Yield: 94%).

$^1$H-NMR (CDCl$_3$, 300 MHz): δ 8.20 (s, 2H), 7.51-7.48 (d, 2H), 7.37-7.32 (d, 2H), 7.20-7.08 (dd, 4H), 3.98 (d, 2H), 1.84 (m, 1H), 1.80-1.40 (m, 8H), 1.09-0.93 (m, 6H)

$^{13}$C-NMR (CDCl$_3$, 75 MHz): δ 159.1, 140.3, 129.2, 128.9, 128.3, 123.6, 123.1, 115.7, 112.7, 111.4, 70.9, 39.4, 30.5, 29.1, 23.9, 23.1, 14.1, 11.1

Synthesis of Compound 1

6.09 g (23.5 mmole) of bis(pinacolato)diboron was added to 5 g (9.4 mmole) of Intermediate 3, 154 mg (0.188 mmole) of dichloro[1,1'-bis(diphenylphosphino)ferrocene]palladium (II) (PdCl$_2$(dppf), 107 mg (0.188 mmole) of dppf(1,1'-bis(diphenylphosphino)-ferrocene), and 5.6 g (56.4 mmole) of potassium acetate (KOAc) in 20 mL of 1,4-dioxane, and the resultant mixture was heated until the temperature reached 100° C. and stirred for 24 hours in a nitrogen atmosphere. After a reaction was completed, the reaction mixture was filtered with a celite pad and washed with CH$_2$Cl$_2$. The filtrate was washed with brine, dried with anhydrous MgSO$_4$, filtered, and concentrated under reduced pressure. The residual was refined by using column chromatography to obtain 23.3 g of Compound 1 (9-(4-((2-ethylhexyl)oxy)phenyl)-3,6-bis(4,4,5,5-tetramethyl-1,3,2-dioxaborolan-2-yl)-9H-carbazole) (Yield: 97%)

$^1$H-NMR (CDCl$_3$, 300 MHz): δ 8.73 (s, 2H), 7.82 (d, 2H), 7.41 (d, 2H), 7.25 (d, 2H), 7.09 (d, 2H), 3.98 (d, 2H), 1.79 (m, 1H), 1.65-1.27 (m, 34H), 0.98 (m, 6H)

Synthesis Example 2

Synthesis of Compound 2

Compound 2 was synthesized according to Reaction Scheme 2 below.

Reaction Scheme 2

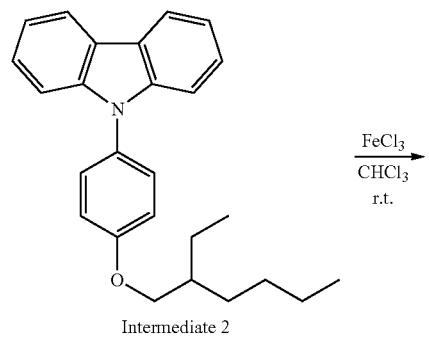

Intermediate 2

FeCl$_3$
CHCl$_3$
r.t.

-continued
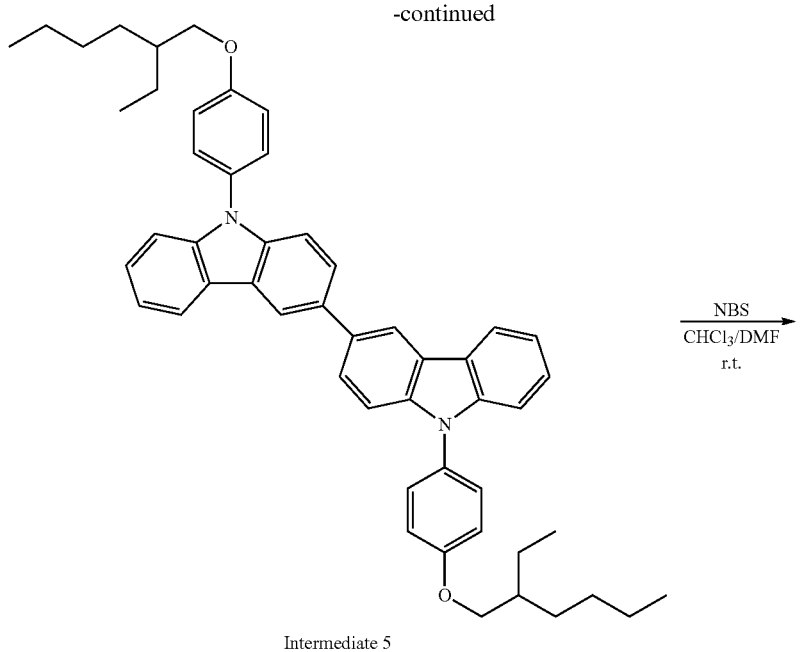
Intermediate 5
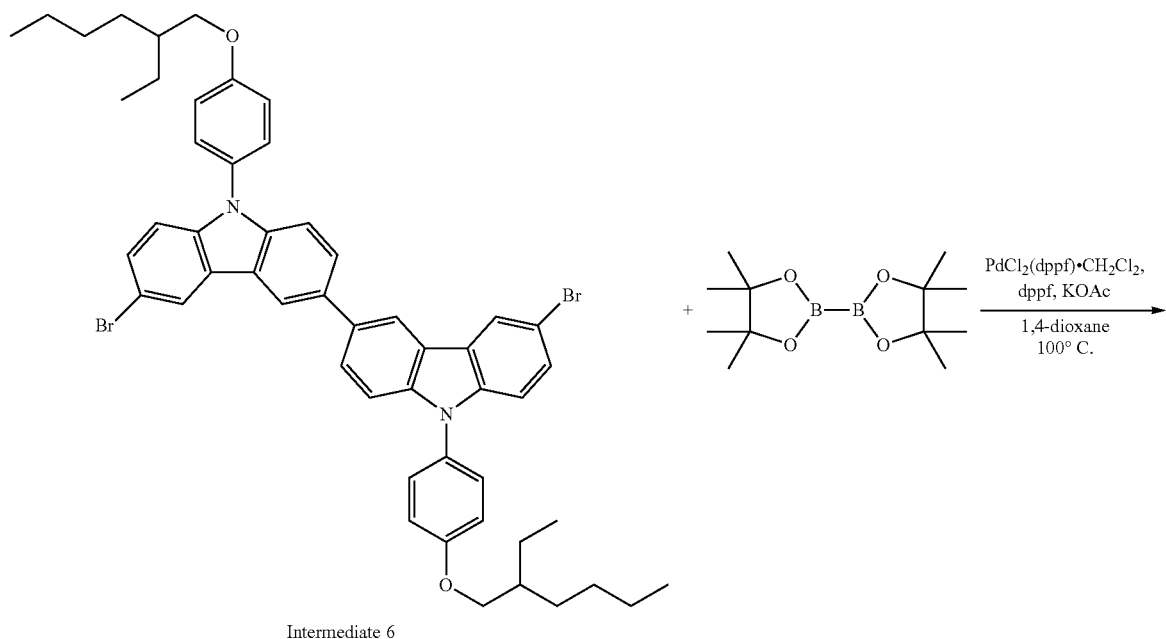
Intermediate 6

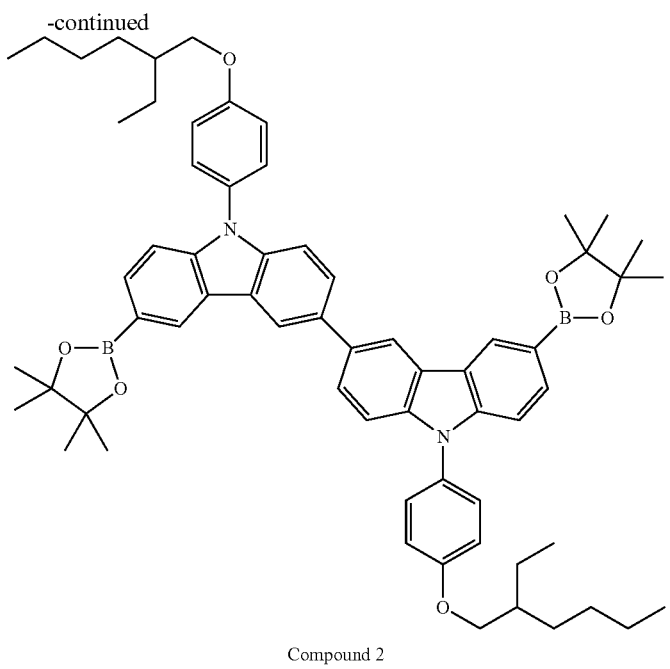

Compound 2

Synthesis of Intermediate 5

In a nitrogen atmosphere, 1.9 g (11.7 mmole) of iron chloride (FeCl$_3$) was added to 2.2 g (5.9 mmole) of Intermediate 2 stirred in 50 mL of CHCl$_3$. After a reaction was completed, water (H$_2$O) was added to the reaction mixture. An organic layer was isolated and dried with anhydrous MgSO$_4$, filtered, and concentrated under reduced pressure. The residual was refined by using column chromatography and re-crystallized using a hexane medium to obtain 1.0 g of Intermediate 5 (9,9'-bis(4-((2-ethylhexyl)oxy)phenyl)-9H,9'H-3,3'-bicarbazole) (Yield: 47%)

$^1$H-NMR (CDCl$_3$, 300 MHz): δ 8.57 (s, 2H), 8.27 (d, 2H), 7.83 (d, 2H), 7.54-7.28 (m, 12H), 7.19-7.16 (d, 4H), 4.01-3.99 (d, 4H), 1.88-1.84 (m, 2H), 1.64-1.44 (m, 20H), 1.08-0.99 (m, 12H)

$^{13}$C-NMR (CDCl$_3$, 75 MHz): δ 158.7, 141.8, 140.5, 134.2, 130.0, 128.4, 125.9, 125.8, 123.7, 123.3, 120.4, 119.7, 118.8, 115.6, 109.9, 109.8, 70.8, 39.5, 30.6, 29.1, 23.9, 23.1, 14.1, 11.2

Synthesis of Intermediate 6

498 mg (2.8 mmole) of NBS was dropped into Intermediate 5 in 1.0 g (1.4 mmole) of a mixture including CHCl$_3$ and DMF (a volumetric ratio of CHCl$_3$ to DMF is 3:1), and a reaction was performed at room temperature. After the reaction was completed, the reaction mixture was washed with brine, extracted with CH$_2$Cl$_2$, dried with anhydrous MgSO$_4$, filtered, and concentrated under reduced pressure. The residual was refined by using column chromatography to obtain 1.2 g of Intermediate 6 (6,6'-dibromo-9,9'-bis(4-((2-ethylhexyl)oxy)phenyl)-9H,9'H-3,3'-bicarbazole) (Yield: 93%).

Synthesis of Compound 2

881 mg (3.4 mmole) of bis(pinacolato)diboron was added to 1.2 g (1.36 mmole) of Intermediate 6, 22 mg (0.0272 mmole) of 1,1'-bis(diphenylphosphino)ferrocene-palladium (II) dichloride dichloromethane (PdCl$_2$(dppf).CH$_2$Cl$_2$), 16 mg (0.0272 mmole) of dppf, and 809 mg (8.16 mmole) of potassium acetate (KOAc) in 30 mL of 1,4-dioxane, and the reaction mixture was heated until the temperature reached 100° C. and stirred for 24 hours in a nitrogen atmosphere. After a reaction was completed, the reaction mixture was filtered with a celite pad and washed with CH$_2$Cl$_2$. The filtrate was washed with brine, dried with anhydrous MgSO$_4$, filtered, and concentrated under reduced pressure. The residual was refined by using column chromatography to obtain 1.0 g of Compound 2 (9,9'-bis(4-((2-ethylhexyl)oxy)phenyl)-6,6'-bis(4,4,5,5-tetramethyl-1,3,2-dioxaborolan-2-yl)-9H,9'H-3,3'-bicarbazole) (Yield: 75%).

$^1$H-NMR (CDCl$_3$, 300 MHz): δ 8.37-8.36 (d, 4H), 7.79-7.76 (d, 2H), 7.53-7.50 (d, 2H), 7.47-7.41 (m, 6H), 7.28-7.16 (d, 2H), 7.13 (d, 4H), 3.99 (d, 4H), 1.86 (m, 2H), 1.80-1.41 (m, 20H), 1.08-0.98 (m, 12H)

$^{13}$C-NMR (CDCl$_3$, 75 MHz): δ 158.9, 140.8, 140.5, 134.2, 129.5, 128.6, 128.3, 126.3, 125.0, 123.1, 122.6, 118.9, 115.7, 112.5, 111.3, 110.2, 70.9, 39.4, 30.6, 29.1, 23.9, 23.1, 14.1, 11.2

Synthesis Example 3

Synthesis of Compound 3

Compound 3 was synthesized according to Reaction Scheme 3 below.

Reaction Scheme 3
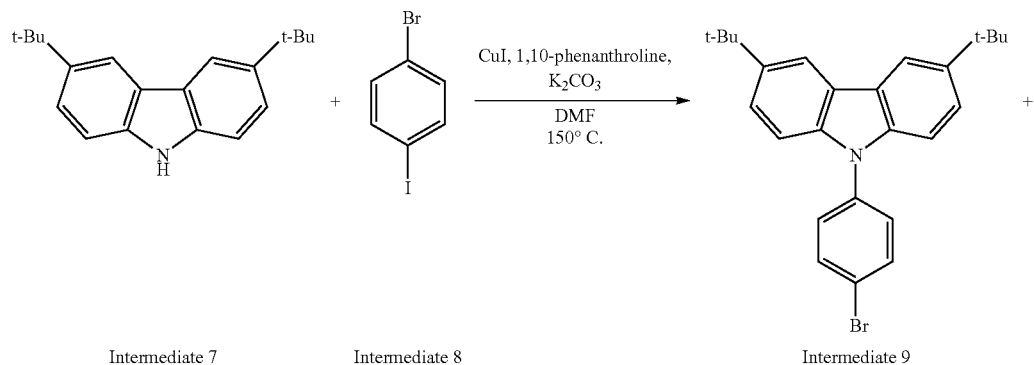
Intermediate 7        Intermediate 8                                Intermediate 9
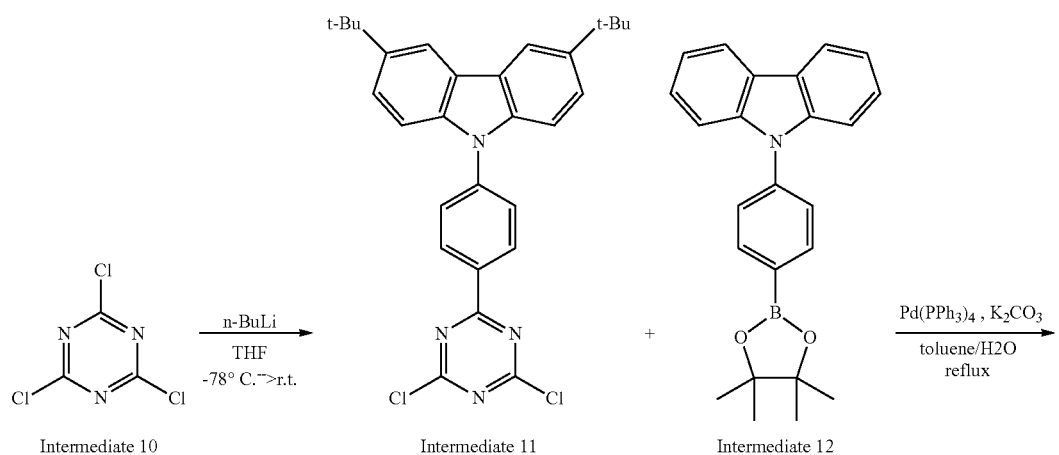
Intermediate 10        Intermediate 11        Intermediate 12
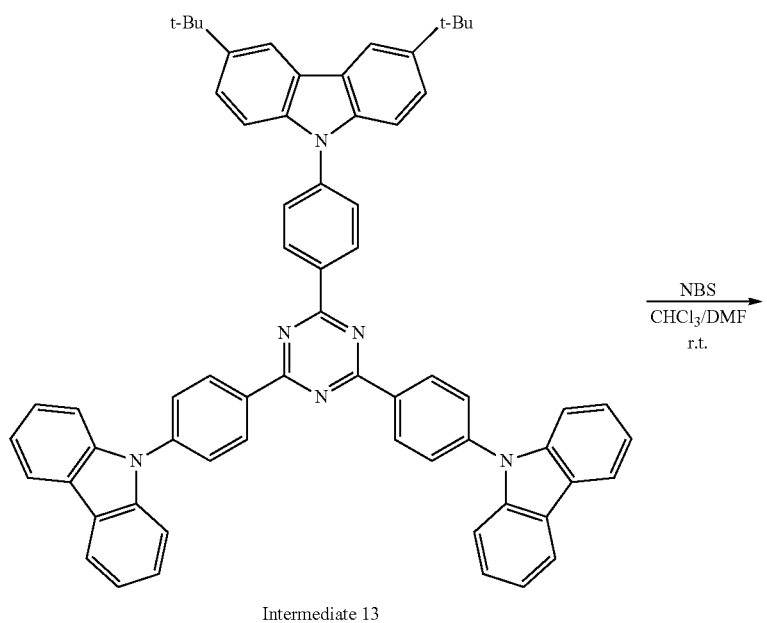
Intermediate 13

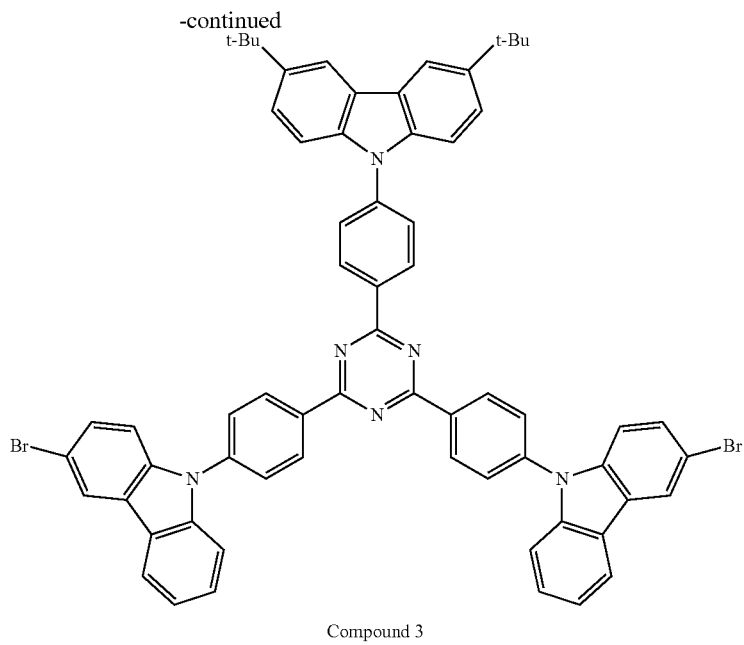

Compound 3

Synthesis of Intermediate 7

30 mL (263.2 mmole) of 2-chloro-2-methylpropane was dropped into a solution including 15.3 g (87.7 mmole) of carbazole and 36.6 g (263.2 mmole) of zinc chloride ($ZnCl_2$) in a nitrogen atmosphere while stirring. After the mixture was stirred at a temperature of 40° C., it was added to $H_2O$. The product was extracted with $CH_2Cl_2$, dried with $MgSO_4$, filtered, and concentrated under reduced pressure to obtain 23 g of Intermediate 7 (Yield 94%), which was in the form of a white solid.

$^1$H NMR ($CDCl_3$, 300 MHz): δ 8.07 (d, 2H), 7.83 (b, 1H), 7.49 (dd, 2H), 7.33 (dd, 2H), 1.44 (s, 18H).

Synthesis of Intermediate 9

In a nitrogen atmosphere, 10 g (35.8 mmole) of Intermediate 7, 20 g (71.6 mole) of Intermediate 8 (obtained from Aldrich Company), 205 mg (1.1 mmole) of copper iodide (CuI), 400 mg (2.2 mmole) of 1,10-phenanthroline, and 7.4 g (53.7 mmole) of $K_2CO_3$ in 100 mL of DMF were heated until the temperature reached 155° C. and the mixture was stirred for 24 hours. After a reaction was completed, the reaction mixture was filtered with a celite pad and washed with $CH_2Cl_2$. The filtrate was washed with brine, dried with anhydrous $MgSO_4$, filtered, and concentrated under reduced pressure. The residual was refined by using column chromatography to obtain Intermediate 9(9-(4-((2-ethylhexyl)oxy)phenyl)-9H-carbazole) (9.6 g, 62%).

Synthesis of Intermediate 11

15 mL (23.98 mmole) of n-butyllithium (n-BuLi) was dropped into 9.5 g (21.87 mmole) of Intermediate 9 in 60 mL of tetrahydrofuran (THF) at a temperature of −78° C. After 30 minutes, 8.1 g (43.74 mmole) of Intermediate 10 (obtained from Aldrich Company) in 40 mL of THF was added to the reaction mixture. The resultant mixture was placed in a cooling bath overnight so that the temperature decreased to room temperature. After a reaction was completed, the reaction was quenched using $H_2O$, and the solvent was removed by evaporation under reduced pressure. The residual was extracted with $CH_2Cl_2$, washed with brine, dried with $MgSO_4$, filtered, and concentrated under reduced pressure. The residual was refined by column chromatography. The resultant product was solidified using 2-propanol to obtain 5.0 g of Intermediate 11 (3,6-di-tert-butyl-9-(4-(4,6-dichloro-1,3,5-triazin-2-yl)phenyl)-9H-carbazole) (Yield: 45%).

Synthesis of Intermediate 13

5.0 g (9.93 mmole) of Intermediate 11, 7.3 g (19.9 mmole) of Intermediate 12, 215 mg (0.186 mmole) of tetrakis(triphenylphosphine)palladium(0) ($Pd(PPh_3)_4$), and 3.9 g (27.9 mmole) of $K_2CO_3$ in 10 mL of a mixture including toluene and $H_2O$ (a volumetric ratio of toluene to $H_2O$ was 4:1) were heated under reduced pressure until the temperature reached a refluxing temperature. After a reaction was completed, the mixture was cooled to room temperature, washed with brine, extracted with $CH_2Cl_2$, dried with anhydrous $MgSO_4$, filtered, and concentrated under reduced pressure. The residual was refined by using column chromatography to obtain 6.01 g of Intermediate (9,9'-((6-(4-(3,6-di-tert-butyl-9H-carbazol-9-yl)phenyl)-1,3,5-triazine-2,4-diyl)bis(4,1-phenylene))bis(9H-carbazole) (66%).

$^1$H-NMR ($CDCl_3$, 300 MHz): δ 8.99-7.28 (m, 34H), 1.54 (s, 18H)

$^{13}$C-NMR ($CDCl_3$, 75 MHz): δ 171.3, 144.3, 143.0, 139.1, 138.7, 138.1, 135.4, 129.7, 128.5, 127.2, 126.9, 123.7, 123.5, 116.3, 109.3, 34.8, 32.0

Synthesis of Compound 3

392 mg (2.2 mmole) of NBS was dropped to 1.0 g (1.1 mmole) of Intermediate 13 in 40 mL of a mixture including $CHCl_3$ and DMF (a volumetric ratio of $CHCl_3$ and DMF was 3:1) and a reaction was performed at room temperature. After the reaction was completed, the reaction mixture was washed with brine, extracted with $CH_2Cl_2$, dried with anhydrous $MgSO_4$, filtered, and concentrated under reduced pressure. The residual was refined by using column chromatography to obtain 1.1 g of Compound 3 (9,9'-((6-(4-(3,6-di-tert-butyl-9H-carbazol-9-yl)phenyl)-1,3,5-triazine-2,4-diyl)bis(4,1-phenylene))bis(3-bromo-9H-carbazole) (Yield: 89%).

Synthesis Example 4

Synthesis of Polymer 1

Polymer 1 having a repeating unit represented by the Polymer 1 formula in Reaction Scheme 4 below was synthesized according to Reaction Scheme 4 below.

Reaction Scheme 4

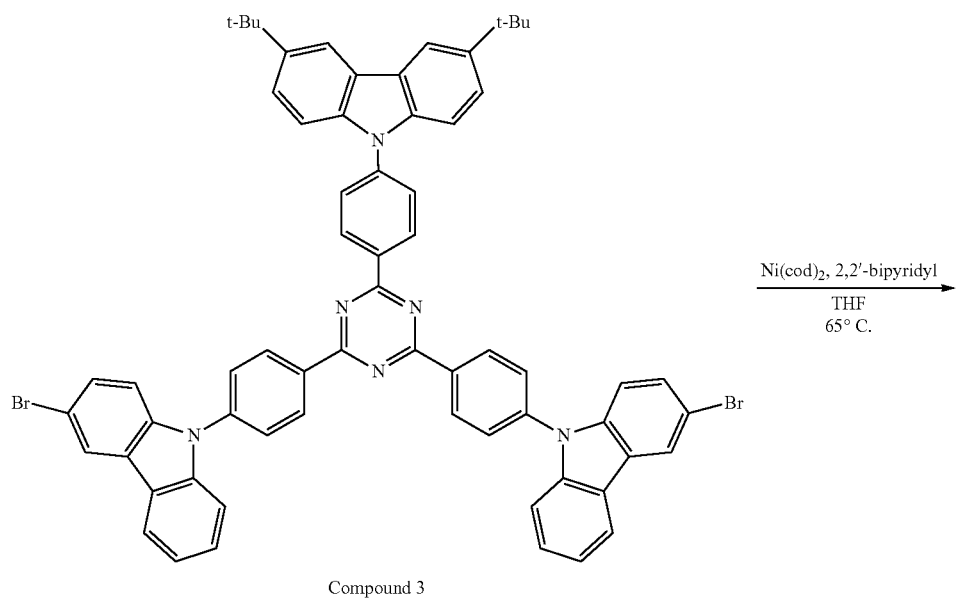

Compound 3

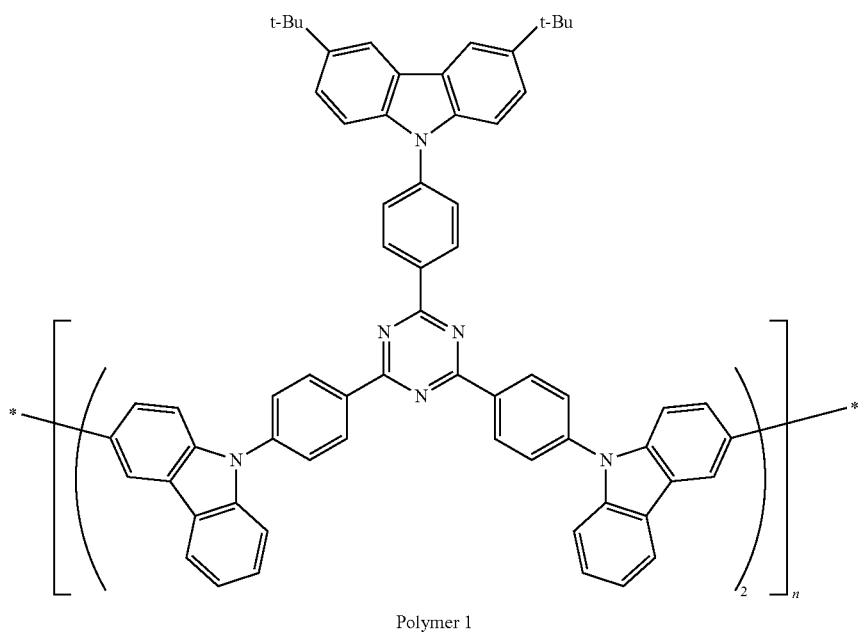

Polymer 1

640 mg (2.325 mmol) of bis(1,5-cyclooctadiene) nickel (Ni(cod)$_2$), 363 mg (2.325 mmole) of 2,2'-bipyridyl, 1 g of Compound 3 (0.93 mmole), and 30 mL of anhydrous THF were loaded into a reactor and the reactor was purged with nitrogen. Polymerization was performed at a temperature of 60° C. for 24 hours, bromobenzene as a terminal capping agent was added to the reactor and then a reaction was performed for 24 hours. The reaction product was purified with Florisil, precipitated with acetone and methanol, and then dried under vacuum conditions for 24 hours to obtain Polymer 1.

GPC: Mw=3.6×10$^5$, Mn=1.2×10$^5$, PDI=3.0

Synthesis Example 5

Polymer 2

Polymer 2 including a repeating unit represented by the Polymer 2 formula in Reaction Scheme 5 below was synthesized according to Reaction Scheme 5 below.

Reaction Scheme 5
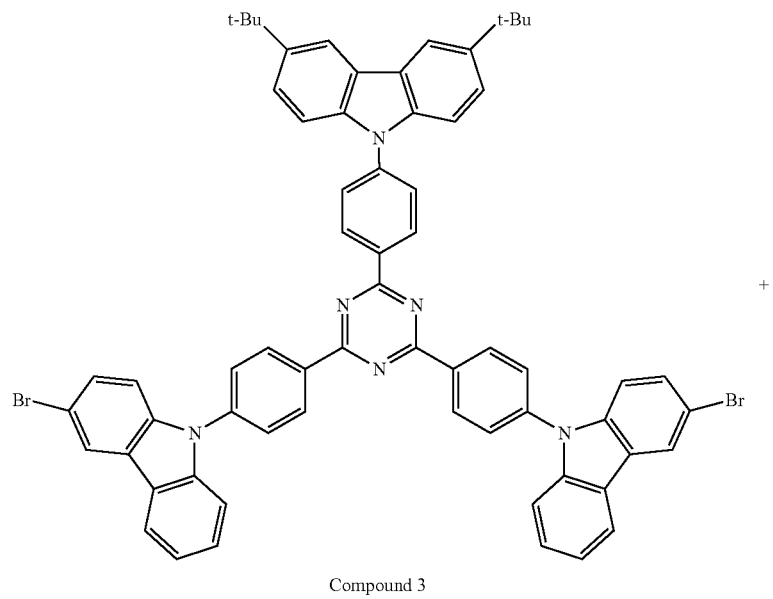
Compound 3
+
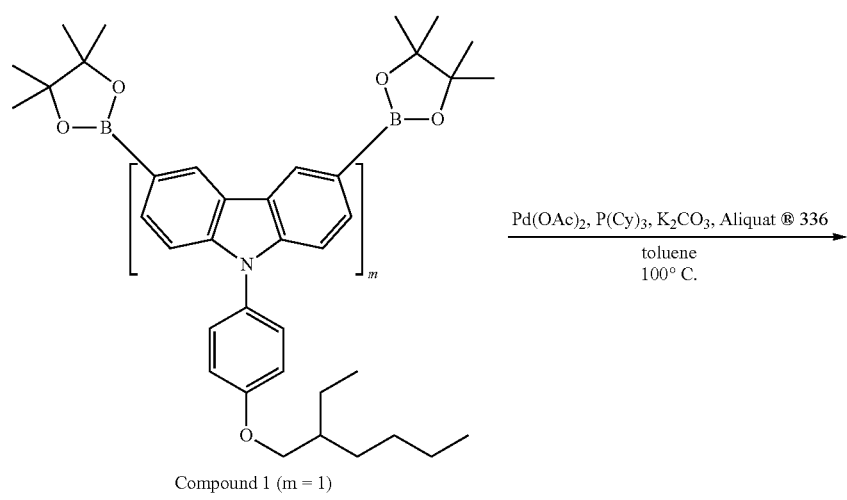
Compound 1 (m = 1)
Pd(OAc)$_2$, P(Cy)$_3$, K$_2$CO$_3$, Aliquat ® 336
toluene
100° C.

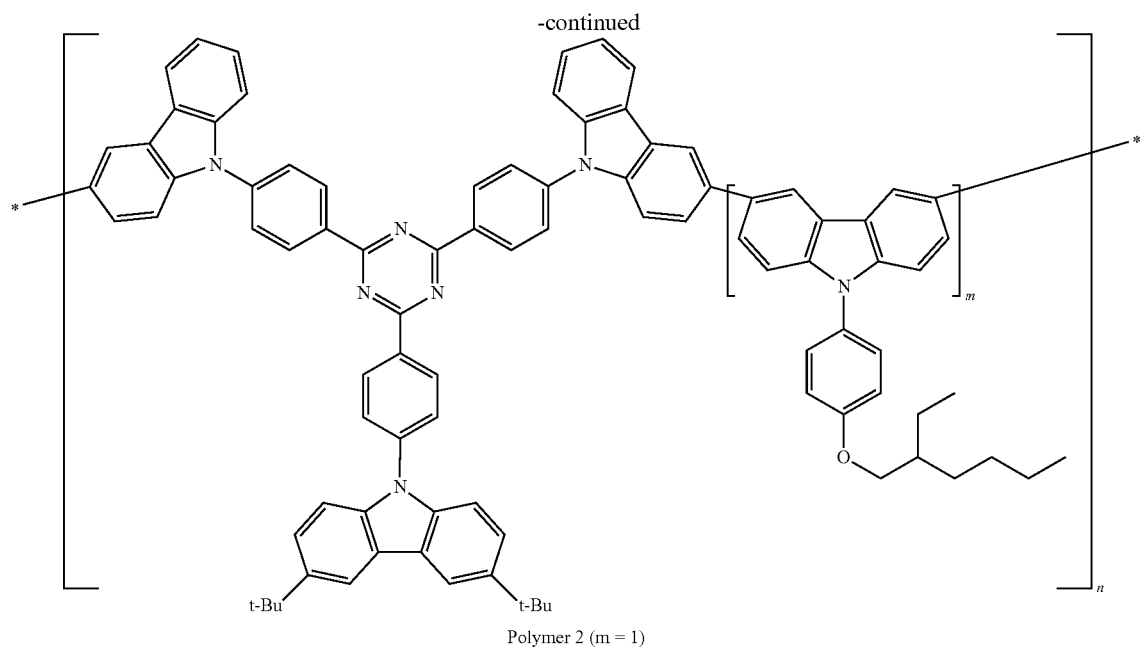

Polymer 2 (m = 1)

500 mg (0.465 mmole) of Compound 3, 348 mg of (0.558 mmole) Compound 1, 21 mg (0.093 mmole) of palladium acetate (Pd(OAc)$_2$), 81 mg (0.279 mmole) of tricyclohexylphosphine (P(Cy)$_3$) and 1.2 mL (2.33 mmole) of K$_2$CO$_3$ (2.0 M in H$_2$O) were loaded into a flask together with Aliquat® 336 in 30 mL of toluene and gas-free water (through a syringe in a nitrogen atmosphere). The mixture was stirred, and heated at a temperature of 100° C. for 24 hours. Then, 2-phenyl-1,3,2-dioxaborinane was added to the obtained polymer and heated for 24 hours, and bromobenzene was added thereto and heated for 24 hours, thereby capping the polymer. The resultant polymer was refined by using Florisil and precipitated in acetone and methanol, and dried for 24 hours under vacuum conditions.

GPC: Mw=9.9×10$^3$, Mn=5.0×10$^3$, PDI=2.0

Synthesis Example 6

Synthesis of Polymer 3

Polymer 3 including a repeating unit represented by the Polymer 3 formula in Reaction Scheme 6 below was synthesized according to Reaction Scheme 6 below.

Reaction Scheme 6

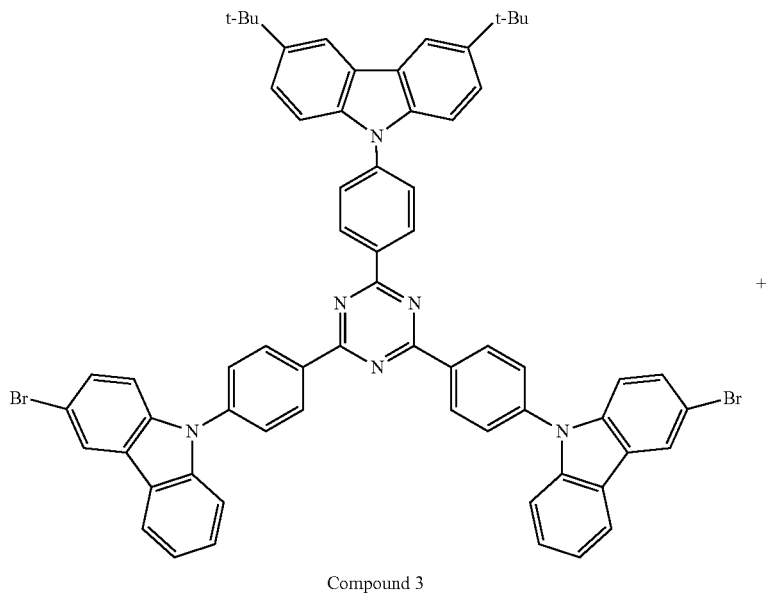

Compound 3

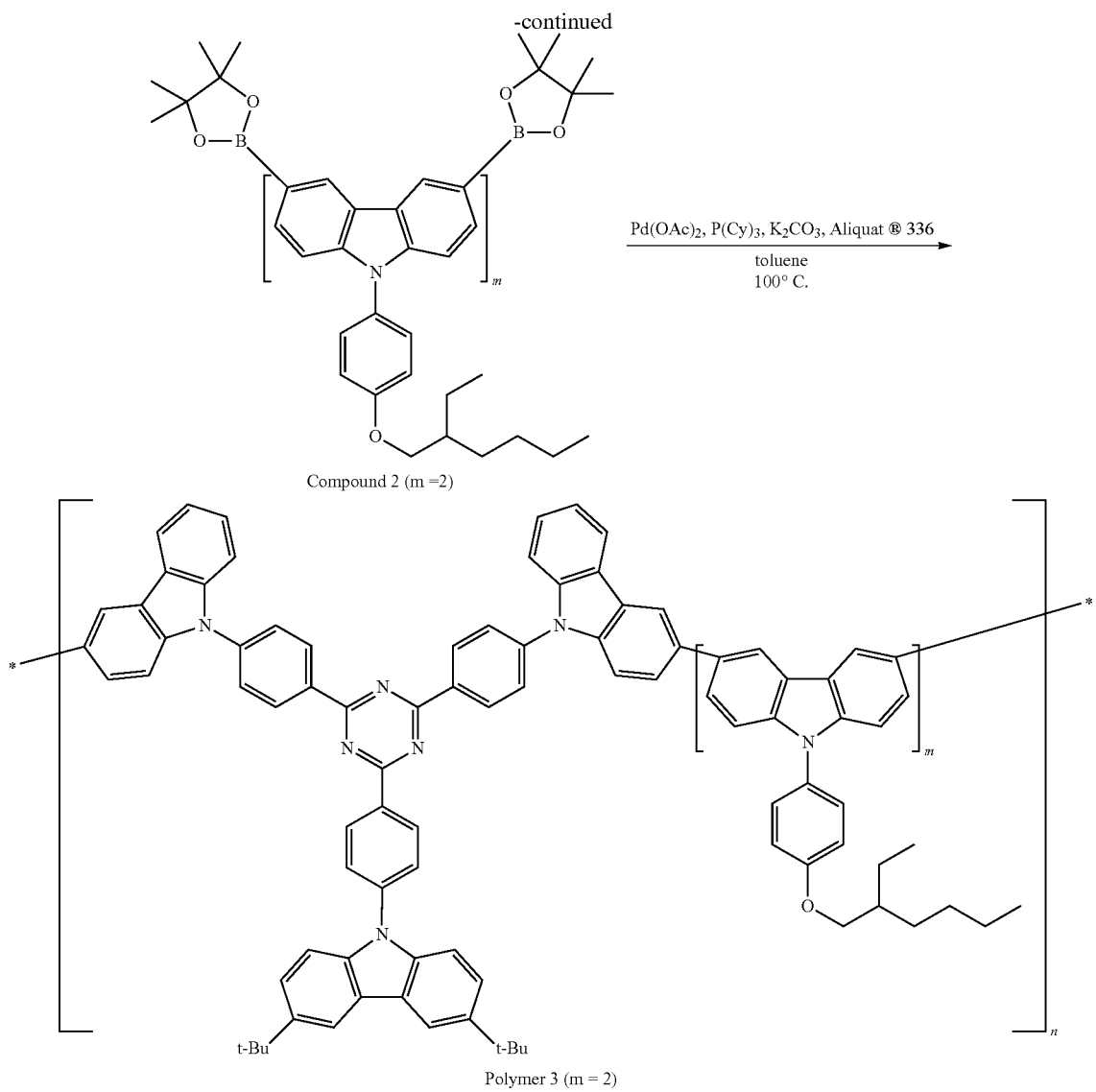

500 mg (0.465 mmole) of Compound 3, 554 mg (0.558 mmole) of Compound 2, 21 mg (0.093 mmole) of Pd(OAc)$_2$, 81 mg (0.279 mmole) of P(Cy)$_3$, and 1.2 mL (2.33 mmole) of K$_2$CO$_3$ (2.0 M in H$_2$O) were loaded into a flask together with Aliquat® 336 in 30 mL of toluene and gas-free water (through a syringe in a nitrogen atmosphere). The mixture was stirred, and heated at a temperature of 100° C. for 24 hours. Then, 2-phenyl-1,3,2-dioxaborinane was added to the obtained polymer and heated for 24 hours, and bromobenzene was added thereto and heated for 24 hours, thereby capping the polymer. The resultant polymer was refined by using Florisil and precipitated in acetone and methanol, and dried for 24 hours under vacuum conditions.

GPC: Mw=8.0×10$^3$, Mn=4.2×10$^3$, PDI=2.0

Evaluation Example 1

Evaluation of Luminescence Characteristics of Polymers 1, 2, and 3 (in Solution State)

Figure 2:
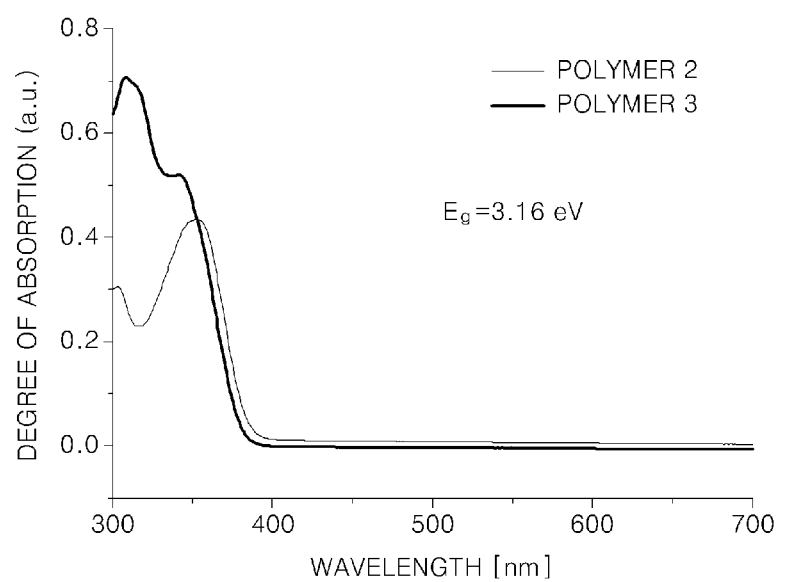
FIG. 2 shows ultraviolet (UV) spectra of polymers 2 and 3 in a solution.

Luminescence characteristics of Polymers 1 to 3 were evaluated by using an ultraviolet (UV) absorption spectrum and a photoluminescence (PL) spectrum. First, Polymer 1 was diluted to a concentration of 0.2 mM by using toluene and a Shimadzu UV-350 spectrometer was used to measure a UV absorption spectrum. The same experiment was performed using Polymers 2 and 3, and the results are shown in FIG. 2. Also, Polymer 1 was diluted to a concentration of 10 mM by using toluene and ISC PC1 spectrofluorometer equipped with a Xenon lamp was used to measure a PL spectrum. The same experiment was performed using Polymers 2 and 3, and the results are shown in FIG. 3.

Figure 3:
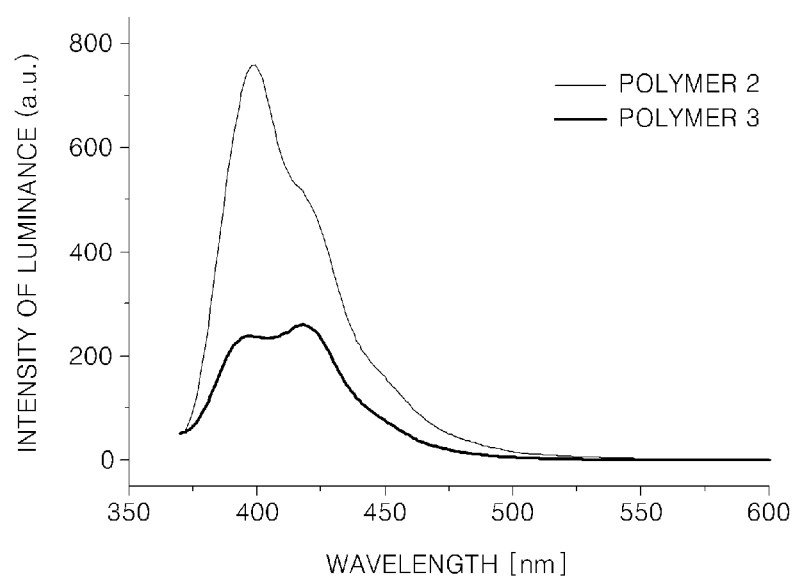
FIG. 3 shows photoluminescence (PL) spectra of polymers 2 and 3 in a solution.

Referring to FIGS. 2 and 3, it was confirmed that Polymers 2 and 3 in solution have excellent luminescence characteristics.

Example 1

An Organic Light-Emitting Device Including Polymer 1

A transparent electrode substrate manufactured by coating a glass substrate with indium-tin oxide (ITO) (having a thickness of 150 nm) was cleaned, and then the ITO layer was patterned to obtain a desired shape by using a photosensitive resin and an etchant and then cleaned. A hole transport layer forming composition that included PEDOT (Batron P 4083 manufactured by Bayer company), whose formula is shown below, was spin coated on the ITO layer, and then baked at a temperature of 200° C. for about 0.5 hours, thereby forming a hole transport layer. An emitting layer forming composition that included Polymer 1 and Ir(mppy)$_3$, Compound 15 below, (10 wt %) in chlorobenzene was spin coated on the hole transport layer, and then baked at a temperature of 120° C. for 30 minutes, thereby forming an emitting layer including Polymer 1 and Ir(mppy)$_3$. Each of the hole transport layer forming composition and the emitting layer forming composition was filtered with a 0.2 millimeter (mm) filter before spin coating. The thickness of the hole transport layer and the emitting layer were adjusted to be 15 nm and 50 nm respectively, by controlling a concentration of the corresponding composition and a spin coating rate. TPBi, whose formula is shown below, was vacuum deposited on the emitting layer while a vacuum pressure was maintained at $4 \times 10^{-6}$ torr or less to form an electron transport layer having a thickness of 40 nm, and then, lithium fluoride (LiF) and aluminum (Al) were sequentially deposited on the electron transport layer to form an electron injection layer (having a thickness of 1 nm) and a second electrode (having a thickness of 100 nm), thereby completing manufacture of an organic light-emitting device. During the deposition, a layer thickness and a layer growth rate were controlled using a crystal sensor.

PEDOT:PSS

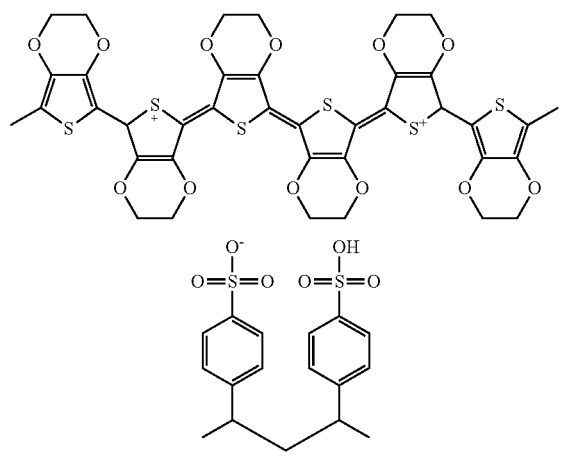

Compound 15: Ir(mppy)$_3$

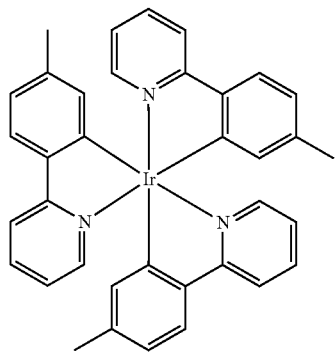

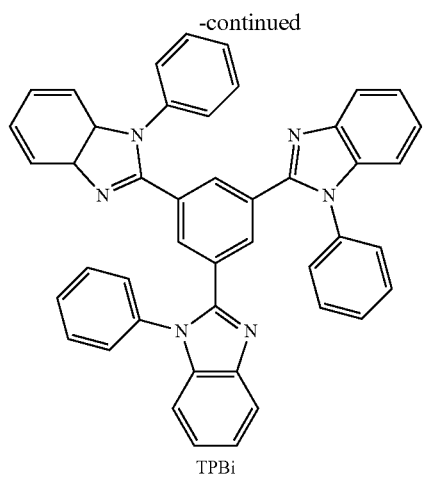

TPBi

Example 2

An Organic Light-Emitting Device Including Polymer 2

An organic light-emitting device was manufactured in the same manner as in Example 1, except that Polymer 2 was used instead of Polymer 1 when an emitting layer was formed.

Example 3

An Organic Light-Emitting Device Including Polymer 3

An organic light-emitting device was manufactured in the same manner as in Example 1, except that Polymer 3 was used instead of Polymer 1 when an emitting layer was formed.

Comparative Example 1

An organic light-emitting device was manufactured in the same manner as in Example 1, except that a mixture including polyvinylcarbazole ("PVK") (having a number average molecular weight ("Mn") of 25,000 Daltons to 50,000 Daltons and a PDI of 2) and 4,4'-di(9H-carbazol-9-yl)-1,1'-biphenyl ("CBP") (where a weight ratio of PVK to CBP was 70:30) was used instead of Polymer 1 when an emitting layer was formed.

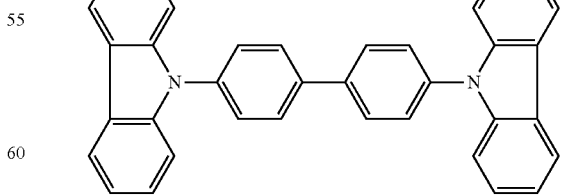

CBP

The structure of each of the organic light-emitting devices manufactured according to Examples 1 to 3 and Comparative Example 1 is shown in Table 1.

TABLE 1

| | Anode | Hole transport layer | Emitting layer | Electron transport layer | Electron injection layer/ cathode |
|---|---|---|---|---|---|
| Example 1 | ITO (150 nm) | PEDOT:PSS (15 nm) | Polymer 1:Ir(mppy)$_3$ (10 wt. %)[1] (50 nm) | TPBi (40 nm) | LiF(1 nm)/ Al(100 nm) |
| Example 2 | ITO (150 nm | PEDOT:PSS (15 nm) | Polymer 2:Ir(mppy)$_3$ (10 wt. %)[1] (50 nm) | TPBi (40 nm) | LiF(1 nm)/ Al(100 nm) |
| Example 3 | ITO (150 nm) | PEDOT:PSS (15 nm) | Polymer 3:Ir(mppy)$_3$ (10 wt. %)[1] (50 nm) | TPBi (40 nm) | LiF(1 nm)/ Al(100 nm) |
| Comparative Example 1 | ITO (150 nm) | PEDOT:PSS (15 nm) | PVK:CBP[1]:Ir(mppy)$_3$ (10 wt. %)[2] (50 nm) | TPBi (40 nm) | LiF(1 nm)/ Al(100 nm) |

[1] A weight ratio of PVK to CBP is 70:30
[2] Amount of Ir(mppy)$_3$ is evaluated based on 100 wt. % of the total weight of an emitting layer Evaluation Example 2

Evaluation of Characteristics of Organic Light-Emitting Device

Figure 4:
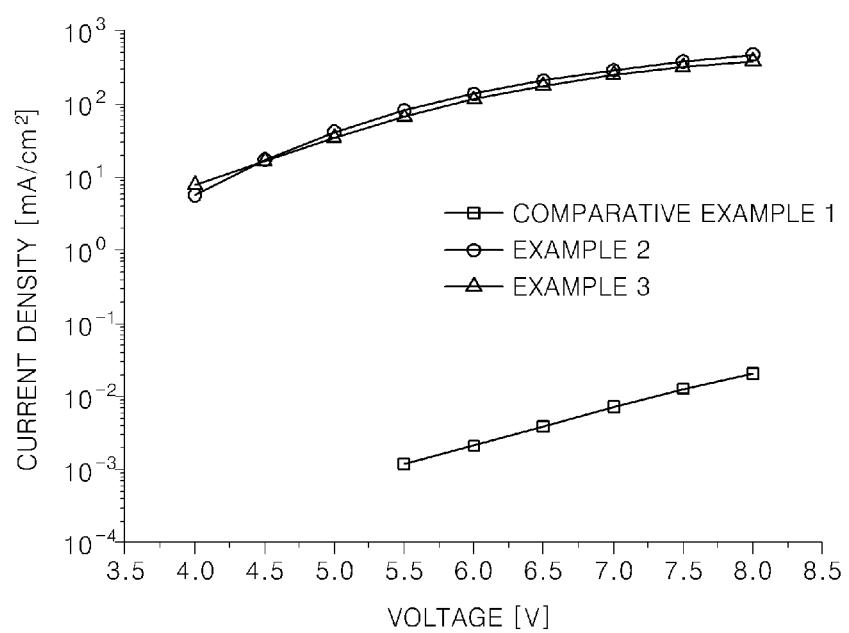
FIG. 4 is a voltage-current density graph of organic light-emitting devices manufactured according to Examples 2 and 3 and Comparative Example 1.
Figure 5:
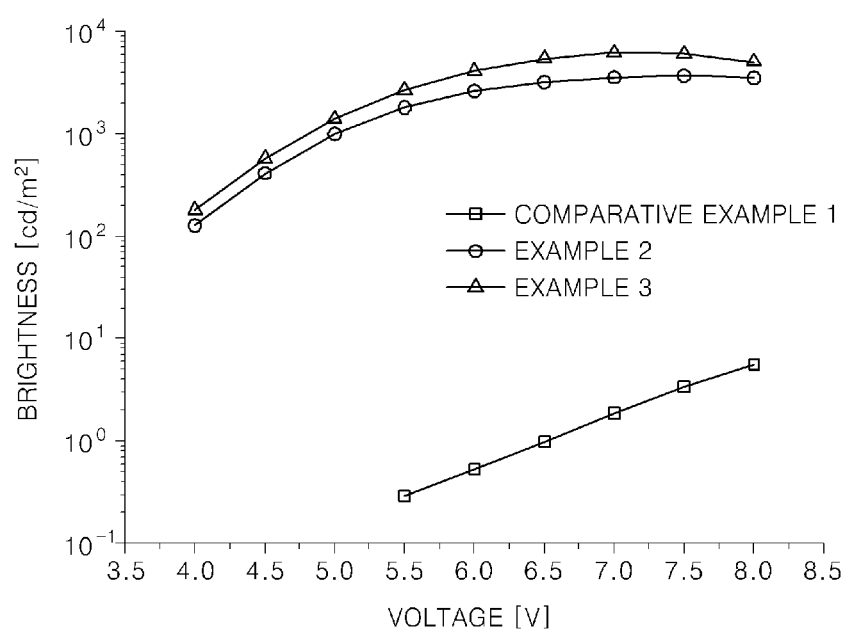
FIG. 5 is a voltage-brightness graph of organic light-emitting devices manufactured according to Examples 2 and 3 and Comparative Example 1.

Current density and brightness of each of the organic light-emitting devices manufactured according to Examples 2 and 3 and Comparative Example 1 were evaluated using a PR650 Spectroscan Source Measurement Unit (Photo Research), and the results are shown in FIGS. 4 and 5.

Referring to FIGS. 4 and 5, it was confirmed that the organic light-emitting devices including Polymers 2 and 3 manufactured according to Examples 2 and 3 respectively, had better current density and brightness characteristics than the organic light-emitting device manufactured according to Comparative Example 1.

As described above, according to the one or more of the embodiments of this disclosure, the polymer including a repeating unit represented by Formula 1, has hole and electron transporting characteristics and high triplet state energy. The organic light-emitting device including the polymer has high efficiency, high current density, and high brightness.

It should be understood that the exemplary embodiments described herein should be considered in a descriptive sense only and not for purposes of limitation. Descriptions of features or aspects within each embodiment should typically be considered as available for other similar features or aspects in other embodiments.

What is claimed is:

1. A polymer comprising a repeating unit represented by Formula 1 below:

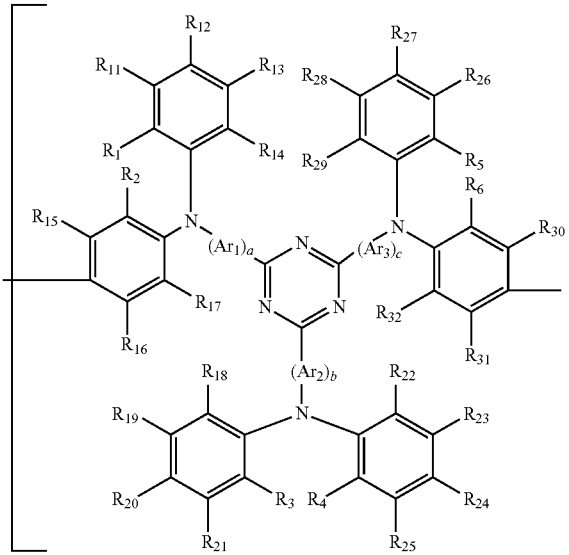

Formula 1

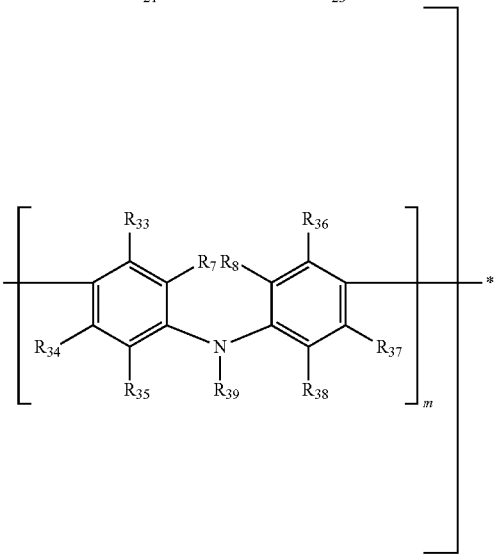

wherein, in Formula 1, two groups in at least one pair of the groups selected from a pair $R_1$ and $R_2$, a pair $R_3$ and $R_4$, a pair $R_5$ and $R_6$, and a pair $R_7$ and $R_8$, are connected to each other via a single bond or a linking group represented by —[C(Q$_6$)(Q$_7$)]$_p$-, or $R_1$ to $R_8$ are each independently hydrogen, deuterium, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, —N($Q_1$)($Q_2$) or —Si($Q_3$)($Q_4$)($Q_5$);

p is an integer of 1 or 2;

$Ar_1$ to $Ar_3$ are each independently a substituted or unsubstituted $C_6$-$C_{30}$ arylene group, or a substituted or unsubstituted $C_1$-$C_{30}$ heteroarylene group;

a, b, and c are each independently an integer of 1 to 10;

$R_{11}$ to $R_{39}$ are each independently hydrogen, deuterium, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, —N($Q_8$)($Q_9$), or —Si($Q_{10}$)($Q_{11}$)($Q_{12}$);

$Q_1$ to $Q_{12}$ are each independently hydrogen, deuterium, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_1$-$C_{60}$ heteroaryl group;

m is an integer of 0 to 5; and

"*" is a point of attachment of each repeat unit of the polymer to an adjacent unit.

2. The polymer of claim 1, wherein two groups in at least one pair of the groups selected from a pair $R_1$ and $R_2$, a pair $R_3$ and $R_4$, a pair $R_5$ and $R_6$, and a pair $R_7$ and $R_8$, are connected to each other via a single bond or a linking group represented by —[C($Q_6$)($Q_7$)]$_p$—, and $Q_6$ and $Q_7$ are each independently hydrogen, deuterium, a halogen atom, a hydroxyl group, a cyano group, a nitro group, a carboxyl group, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_6$-$C_{14}$ aryl group, or a substituted or unsubstituted $C_1$-$C_{14}$ heteroaryl group.

3. The polymer of claim 1, wherein $Ar_1$ to $Ar_3$ are each independently a substituted or unsubstituted phenylene group, a substituted or unsubstituted pentalenylene group, a substituted or unsubstituted indenylene group, a substituted or unsubstituted naphthylene group, a substituted or unsubstituted azulenylene group, a substituted or unsubstituted heptalenylene group, a substituted or unsubstituted indacenylene group, a substituted or unsubstituted acenaphthylene group, a substituted or unsubstituted fluorenylene group, a substituted or unsubstituted phenanthrylene group, a substituted or unsubstituted anthrylene group, a substituted or unsubstituted fluoranthenylene group, a substituted or unsubstituted triphenylene group, a substituted or unsubstituted pyrenylene group, a substituted or unsubstituted chrysenylene group, a substituted or unsubstituted naphthacenylene group, a substituted or unsubstituted picenylene group, a substituted or unsubstituted perylenylene group, a substituted or unsubstituted pentaphenylene group, a substituted or unsubstituted hexacenylene group, a substituted or unsubstituted pyrrolylene group, a substituted or unsubstituted pyrazolylene group, a substituted or unsubstituted imidazolylene group, a substituted or unsubstituted imidazolinylene group, a substituted or unsubstituted imidazopyridinylene group, a substituted or unsubstituted imidazopyrimidinylene group, a substituted or unsubstituted pyridinylene group, a substituted or unsubstituted pyrazinylene group, a substituted or unsubstituted pyrimidinylene group, a substituted or unsubstituted indolylene group, a substituted or unsubstituted purinylene group, a substituted or unsubstituted quinolinylene group, a substituted or unsubstituted phthalazinylene group, a substituted or unsubstituted indolizinylene group, a substituted or unsubstituted naphthyridinylene group, a substituted or unsubstituted quinazolinylene group, a substituted or unsubstituted cinnolinylene group, a substituted or unsubstituted indazolylene group, a substituted or unsubstituted carbazolylene group, a substituted or unsubstituted phenazinylene group, a substituted or unsubstituted phenanthridinylene group, a substituted or unsubstituted pyranylene group, a substituted or unsubstituted chromenylene group, a substituted or unsubstituted benzofuranylene group, a substituted or unsubstituted thiophenylene group, a substituted or unsubstituted benzothiophenylene group, a substituted or unsubstituted isothiazolylene group, a substituted or unsubstituted benzoimidazolylene group, or a substituted or unsubstituted isoxazolylene group.

4. The polymer of claim 1, wherein $Ar_1$ to $Ar_3$ are each independently a phenylene group, a ($C_1$-$C_{10}$ alkyl)-substituted phenylene group, a di($C_1$-$C_{10}$ alkyl)-substituted phenylene group, a ($C_6$-$C_{14}$ aryl)-substituted phenylene group, a di($C_6$-$C_{14}$ aryl)-substituted phenylene group, a fluorenylene group, a ($C_1$-$C_{10}$ alkyl)-substituted fluorenylene group, a di($C_1$-$C_{10}$ alkyl)-substituted fluorenylene group, a ($C_6$-$C_{14}$ aryl)-substituted fluorenylene group, a di($C_6$-$C_{14}$ aryl)-substituted fluorenylene group, a phenanthrylene group, a ($C_1$-$C_{10}$ alkyl)-substituted phenanthrylene group, a di($C_1$-$C_{10}$ alkyl)-substituted phenanthrylene group, a ($C_6$-$C_{14}$ aryl)-substituted phenanthrylene group, a di($C_6$-$C_{14}$ aryl)-substituted phenanthrylene group, a pyridinylene group, a ($C_1$-$C_{10}$ alkyl)-substituted pyridinylene group, a di($C_1$-$C_{10}$ alkyl)-substituted pyridinylene group, a ($C_6$-$C_{14}$ aryl)-substituted pyridinylene group, or a di($C_6$-$C_{14}$ aryl)-substituted pyridinylene group.

5. The polymer of claim 1, wherein a, b, and c are each independently 1, 2, 3, or 4.

6. The polymer of claim 1, wherein $R_{11}$ to $R_{39}$ are each independently hydrogen, deuterium, a halogen atom, a hydroxyl group, a cyano group, a nitro group, a carboxyl group, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_6$-$C_{14}$ aryl group, or a substituted or unsubstituted $C_1$-$C_{14}$ heteroaryl group.

7. The polymer of claim 1, wherein $R_{11}$ to $R_{19}$, $R_{21}$ to $R_{23}$, and $R_{25}$ to $R_{38}$ are all hydrogen, and $R_{20}$, $R_{24}$ and $R_{39}$ are each independently hydrogen, deuterium, a halogen atom, a hydroxyl group, a cyano group, a nitro group, a carboxyl group, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_6$-$C_{14}$ aryl group, or a substituted or unsubstituted $C_1$-$C_{14}$ heteroaryl group.

8. The polymer of claim 1, wherein m is 0, 1, or 2.
9. The polymer of claim 1, wherein the repeating unit is represented by Formula 1A, 1B, or 1C below:
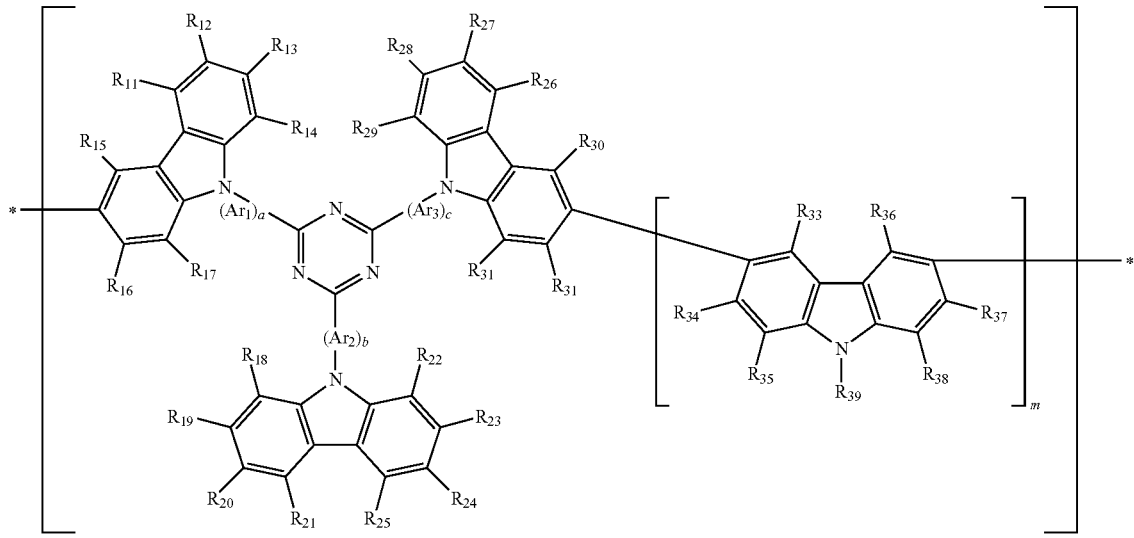
Formula 1A
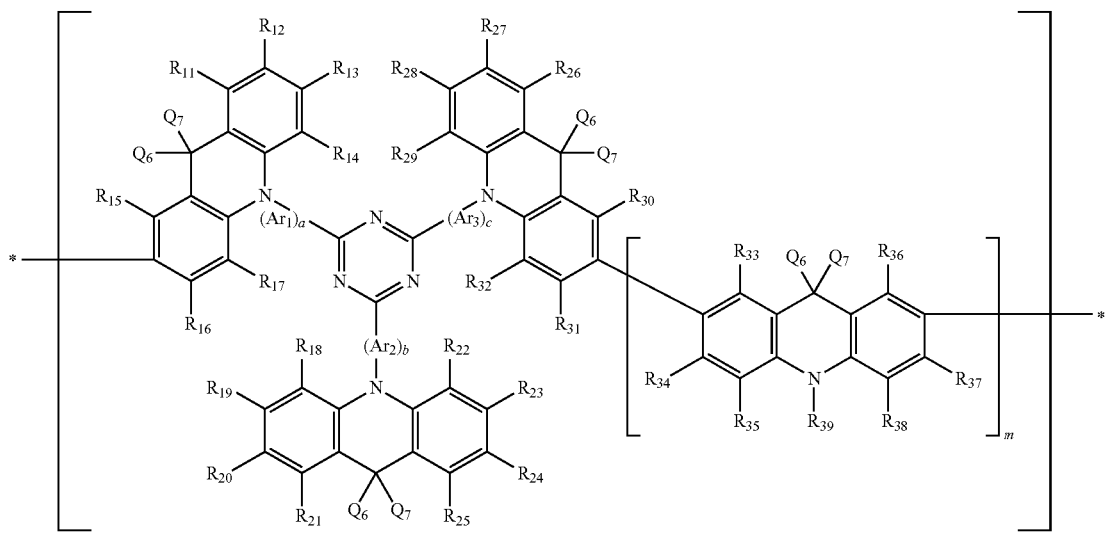
Formula 1B -continued

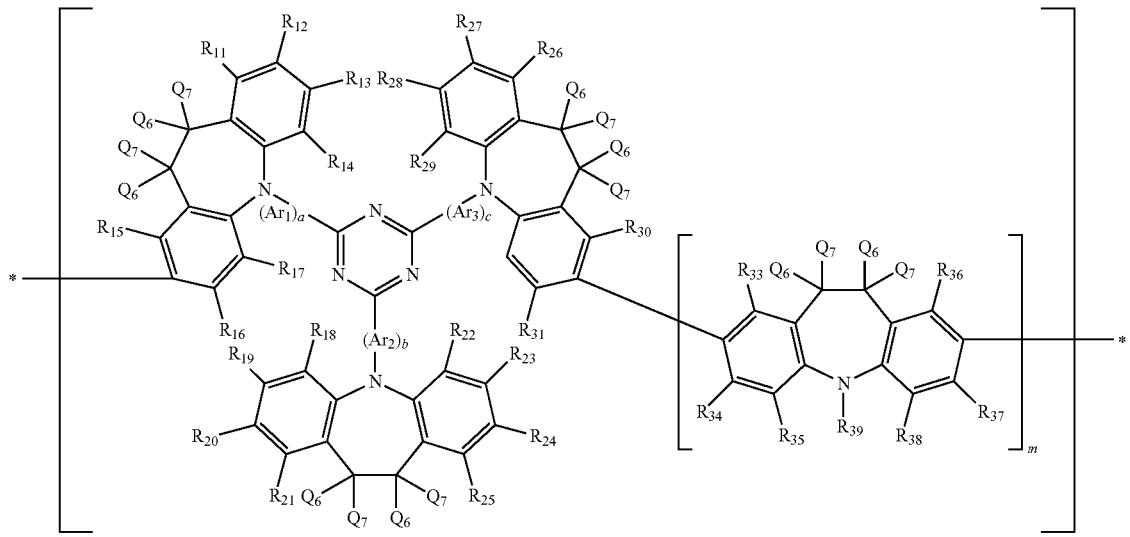

Formula 1C wherein, in Formulae 1A, 1B, and 1C, $R_{11}$ to $R_{39}$ and $Q_6$ and $Q_7$ are each independently hydrogen, deuterium, a halogen atom, a hydroxyl group, a cyano group, a nitro group, a carboxyl group, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_6$-$C_{14}$ aryl group, or a substituted or unsubstituted $C_1$-$C_{14}$ heteroaryl group;

$Ar_1$ to $Ar_3$ are each independently a substituted or unsubstituted phenylene group, a substituted or unsubstituted fluorenylene group, a substituted or unsubstituted phenanthrylene group, or a substituted or unsubstituted pyridinylene group, or a substituted or unsubstituted phenylpyridinylene group;

a, b, and c are each independently an integer of 1 to 10;

m is 0, 1, or 2; and

"*" is a point of attachment of each repeat unit of the polymer to an adjacent unit.

10. The polymer of claim 9, wherein $R_{11}$ to $R_{19}$, $R_{21}$ to $R_{23}$, and $R_{25}$ to $R_{38}$ are all hydrogen, and $R_{20}$, $R_{24}$, and $R_{39}$ are each independently hydrogen, deuterium, a halogen atom, a hydroxyl group, a cyano group, a nitro group, a carboxyl group, a substituted or unsubstituted $C_1$-$C_{10}$ alkyl group, a substituted or unsubstituted $C_2$-$C_{10}$ alkenyl group, a substituted or unsubstituted $C_1$-$C_{10}$ alkoxy group, a substituted or unsubstituted $C_6$-$C_{14}$ aryl group, or a substituted or unsubstituted $C_1$-$C_{14}$ heteroaryl group.

11. The polymer of claim 9, wherein $Ar_1$ to $Ar_3$ are each independently a substituted or unsubstituted phenylene group, a substituted or unsubstituted fluorenylene group, a substituted or unsubstituted phenanthrylene group, a substituted or unsubstituted pyridinylene group, or a substituted or unsubstituted phenylpyridinylene group; and a, b, and c are each independently 1, 2, 3, or 4.

12. The polymer of claim 1, wherein the repeating unit is represented by Formula 1A-1 below:

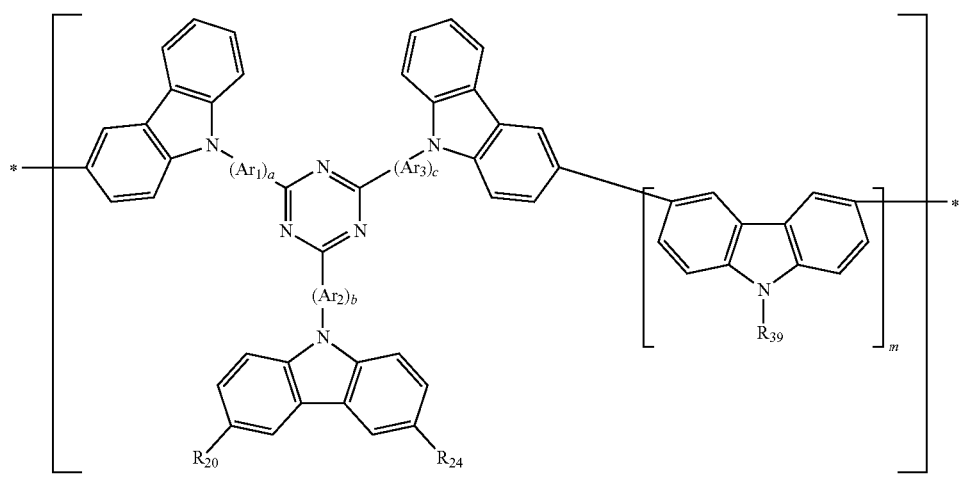

Formula 1A-1 wherein, in Formula 1A-1, $R_{20}$, $R_{24}$ and $R_{39}$ are each independently hydrogen, deuterium, a halogen atom, a hydroxyl group, a cyano group, a nitro group, a carboxyl group, a $C_1$-$C_{10}$ alkyl group, or a $C_1$-$C_{10}$ alkoxy group;

$Ar_1$ to $Ar_3$ are each independently a substituted or unsubstituted phenylene group, a substituted or unsubstituted fluorenylene group, a substituted or unsubstituted phenanthrylene group, a substituted or unsubstituted pyridinylene group, or a substituted or unsubstituted phenylpyridinylene group;

a, b, and c are each independently 1, 2, 3 or 4;

m is 0, 1, or 2; and

"*" is a point of attachment of each repeat unit of the polymer to an adjacent unit.

13. The polymer of claim 1, wherein when the two groups in at least one pair of the groups selected from a pair $R_1$ and $R_2$, a pair $R_3$ and $R_4$, a pair $R_5$ and $R_6$, and a pair $R_7$ and $R_8$, are not connected to each other via a single bond or a linking group represented by —[C($Q_6$)($Q_7$)]$_p$-, $R_1$ to $R_8$ are simultaneously hydrogen, deuterium, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, a substituted or unsubstituted $C_1$-$C_{60}$ heteroaryl group, —N($Q_1$)($Q_2$) or —Si($Q_3$)($Q_4$)($Q_5$), wherein $Q_1$ to $Q_5$ are each independently hydrogen, deuterium, a halogen atom, a hydroxyl group, a cyano group, a nitro group, a carboxyl group, a substituted or unsubstituted $C_1$-$C_{60}$ alkyl group, a substituted or unsubstituted $C_2$-$C_{60}$ alkenyl group, a substituted or unsubstituted $C_2$-$C_{60}$ alkynyl group, a substituted or unsubstituted $C_1$-$C_{60}$ alkoxy group, a substituted or unsubstituted $C_3$-$C_{60}$ cycloalkyl group, a substituted or unsubstituted $C_3$-$C_{60}$ cycloalkenyl group, a substituted or unsubstituted $C_6$-$C_{60}$ aryl group, a substituted or unsubstituted $C_6$-$C_{60}$ aryloxy group, a substituted or unsubstituted $C_6$-$C_{60}$ arylthio group, or a substituted or unsubstituted $C_1$-$C_{60}$ heteroaryl group.

14. The polymer of claim 1, wherein when the two groups in at least one pair of the groups selected from a pair $R_1$ and $R_2$, a pair $R_3$ and $R_4$, a pair $R_5$ and $R_6$, and a pair $R_7$ and $R_8$, are not connected to each other via a single bond or a linking group represented by -[C($Q_6$)($Q_7$)]$_p$-, $R_1$ to $R_8$ are each independently hydrogen, deuterium, a halogen atom, a hydroxyl group, a cyano group, a nitro group, a carboxyl group, a substituted or unsubstituted $C_1$-$C_{10}$ alkyl group, or a substituted or unsubstituted $C_1$-$C_{10}$ alkoxy group.

15. The polymer of claim 1, wherein a weight average molecular weight of the polymer is about 2,000 Daltons to about 1,000,000 Daltons.

16. The polymer of claim 1, wherein the polymer is a bipolar polymer that functions as a phosphorescent host.

17. An organic light-emitting device comprising a substrate;
a first electrode;
a second electrode;
and a first layer disposed between the first electrode and the second electrode, wherein the first layer comprises the polymer of claim 1.

18. The organic light-emitting device of claim 17, wherein the first layer is an emitting layer and further comprises a phosphorescent dopant.

19. The organic light-emitting device of claim 18, wherein the phosphorescent dopant is an organometallic complex comprising iridium, platinum, osmium, rhenium, titanium, zirconium, hafnium, or a combination thereof.

20. The organic light-emitting device of claim 18, wherein an amount of the phosphorescent dopant in the first layer is about 1 wt. % to about 10 wt. % based on the total weight of the first layer.

* * * * *